United States Patent
Nishimura et al.

(10) Patent No.: US 10,014,072 B2
(45) Date of Patent: Jul. 3, 2018

(54) DIAGNOSIS METHOD FOR DIAGNOSING MEMORY, TRANSMISSION APPARATUS, AND COMPUTER-READABLE RECORDING MEDIUM

(71) Applicant: FUJITSU LIMITED, Kawasaki-shi, Kanagawa (JP)

(72) Inventors: Hiroyuki Nishimura, Kawasaki (JP); Yukio Suda, Shimotsuke (JP); Satoshi Nemoto, Oyama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/335,783

(22) Filed: Oct. 27, 2016

(65) Prior Publication Data

US 2017/0125126 A1 May 4, 2017

(30) Foreign Application Priority Data

Nov. 2, 2015 (JP) .................................. 2015-215763

(51) Int. Cl.
*H03K 7/08* (2006.01)
*G11C 7/10* (2006.01)
(Continued)

(52) U.S. Cl.
CPC .............. *G11C 29/12* (2013.01); *G06F 13/16* (2013.01); *G11C 7/10* (2013.01); *G11C 7/222* (2013.01); *G11C 29/022* (2013.01); *G11C 29/1201* (2013.01); *G11C 29/12015* (2013.01); *G11C 29/50012* (2013.01); *G11C 29/36* (2013.01); *G11C 2029/0409* (2013.01)

(58) Field of Classification Search
None
See application file for complete search history.

(56) References Cited

U.S. PATENT DOCUMENTS

| 4,387,423 A * | 6/1983 | King .................... G11C 11/406 365/222 |
| 6,445,627 B1 * | 9/2002 | Nakahara ............ G11C 29/028 365/200 |

(Continued)

FOREIGN PATENT DOCUMENTS

| JP | 05-236562 | 9/1993 |
| JP | 2005-309787 | 11/2005 |
| JP | 2009-296320 | 12/2009 |

*Primary Examiner* — Son Dinh
*Assistant Examiner* — Sultana Begum
(74) *Attorney, Agent, or Firm* — Fujitsu Patent Center

(57) ABSTRACT

A diagnosis method executed by a processor includes receiving signal data at a timing of a first clock signal; setting a diagnosis period to perform a diagnosis of a memory with a predetermined period; executing a write operation and a read operation of the signal data on the memory at a timing of a second clock signal that is higher in rate than the first clock signal within the diagnosis period; executing at least one of operations included in the diagnosis of the memory using diagnosis data at a timing of the second clock signal during a period responsive to a difference between a number of first clock pulses of the first clock signal within the diagnosis period and a number of second clock pulses of the second clock signal within the diagnosis period; and diagnosing the memory by repeating the diagnosis period by a plurality of times.

14 Claims, 15 Drawing Sheets

(51) Int. Cl.
  *G11C 29/12*   (2006.01)
  *G11C 7/22*    (2006.01)
  *G06F 13/16*   (2006.01)
  *G11C 29/02*   (2006.01)
  *G11C 29/50*   (2006.01)
  *G11C 29/04*       (2006.01)
  *G11C 29/36*       (2006.01)

(56)          References Cited

U.S. PATENT DOCUMENTS

2005/0262401 A1    11/2005  Saitou
2009/0135897 A1*    5/2009  Soma .................. H03F 3/217
                                                      375/238
2009/0287867 A1*   11/2009  Takehara ............ G06F 11/0745
                                                      710/110
2016/0063933 A1*    3/2016  Kobayashi ........... G09G 3/3614
                                                      345/691

* cited by examiner

DIAGNOSIS METHOD FOR DIAGNOSING MEMORY, TRANSMISSION APPARATUS, AND COMPUTER-READABLE RECORDING MEDIUM

CROSS-REFERENCE TO RELATED APPLICATION

This application is based upon and claims the benefit of priority of the prior Japanese Patent Application No. 2015-215763, filed on Nov. 2, 2015, the entire contents of which are incorporated herein by reference.

FIELD

The embodiments discussed herein are related to a transmission apparatus, a diagnosis method, and a computer-readable recording medium.

BACKGROUND

A transmission apparatus, such the L2 switch, performs a variety of processes including a rewrite process of a packet, or a forwarding process, by saving a received packet on a memory, and performing read-write control on the packet stored on the memory. For example, communication traffic volume has been drastically increasing as smart phones or tablet terminals are in widespread use or a variety of network services becomes available. As a result, the capacity of a memory used in a large scale integration (LSI) or a field programmable gate array (FPGA) in transmission apparatuses tends to increase. With a higher memory capacity, an occurrence rate of memory error, such as a single event upset or a physical fault is increasing accordingly.

If a memory error occurs on a large-size and high-rate packet, the transmission apparatus suffers from a pronounced effect, such as a packet loss and communication interruption. For this reason, even while the transmission apparatus is active in service, the fault diagnosis is performed to quickly detect a memory error. Related art techniques are disclosed in Japanese Laid-open Patent Publication No. 2009-296320 and Japanese Laid-open Patent Publication No. 5-236562.

FIG. 13A illustrates an example of a fault diagnosis timing. FIG. 13B illustrates another example of the fault diagnosis timing. A transmission apparatus performs a fault diagnosis 303 on an internal memory thereof during an idle time duration 302 between a memory control operation 301 and another memory control operation 301 as illustrated in FIG. 13A while performing memory control, such as read and write operations on the internal memory. As a result, the transmission apparatus performs the fault diagnosis during the system operation.

The transmission apparatus receives data without interruption as illustrated in FIG. 13B since data is handled in a larger amount at a higher rate. With the idle time duration 302 difficult to insert between the memory control operations 301, the fault diagnosis 303 is not performed. For this reason, the fault diagnosis is desirably performed in active operation.

SUMMARY

According to an aspect of the invention, a fault diagnosis method executed by a processor included in a transmission apparatus, the fault diagnosis method includes receiving signal data at a timing of a first clock signal; setting a diagnosis period to perform a fault diagnosis on a memory with a predetermined period; executing a write operation and a read operation of the signal data on the memory at a timing of a second clock signal that is higher in rate than the first clock signal within the diagnosis period; executing at least one of operations included in the fault diagnosis of the memory using diagnosis data at a timing of the second clock signal during a period responsive to a difference between a number of first clock pulses of the first clock signal within the diagnosis period and a number of second clock pulses of the second clock signal within the diagnosis period; and diagnosing a fault of the memory by repeating the diagnosis period by a plurality of times.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A transmission apparatus and a fault diagnosis method as embodiments of the disclosure are described with reference to the drawings. The embodiments are not intended to limit the technique disclosed herein. The embodiments described below may be appropriately combined as long as such a combination gives rise to no inconsistency.

First Embodiment

Figure 1:
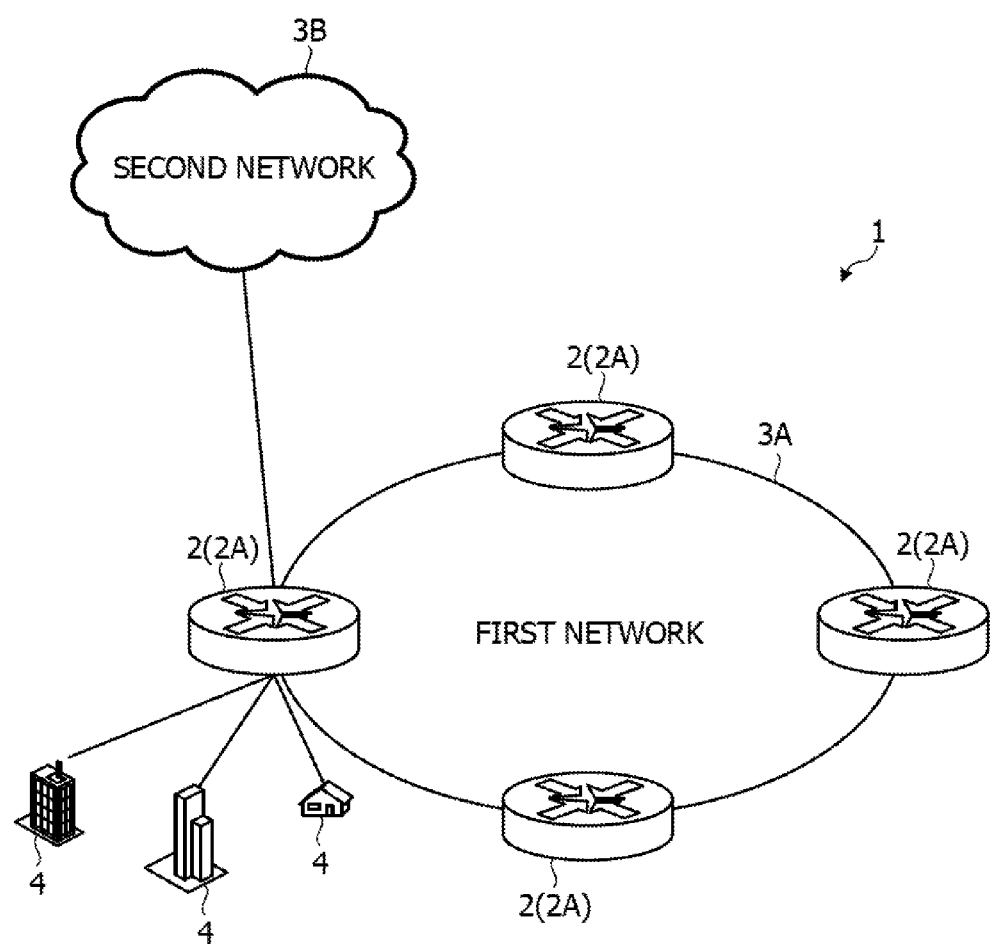
FIG. 1 is an example of a transmission system of a first embodiment.
Figure 2:
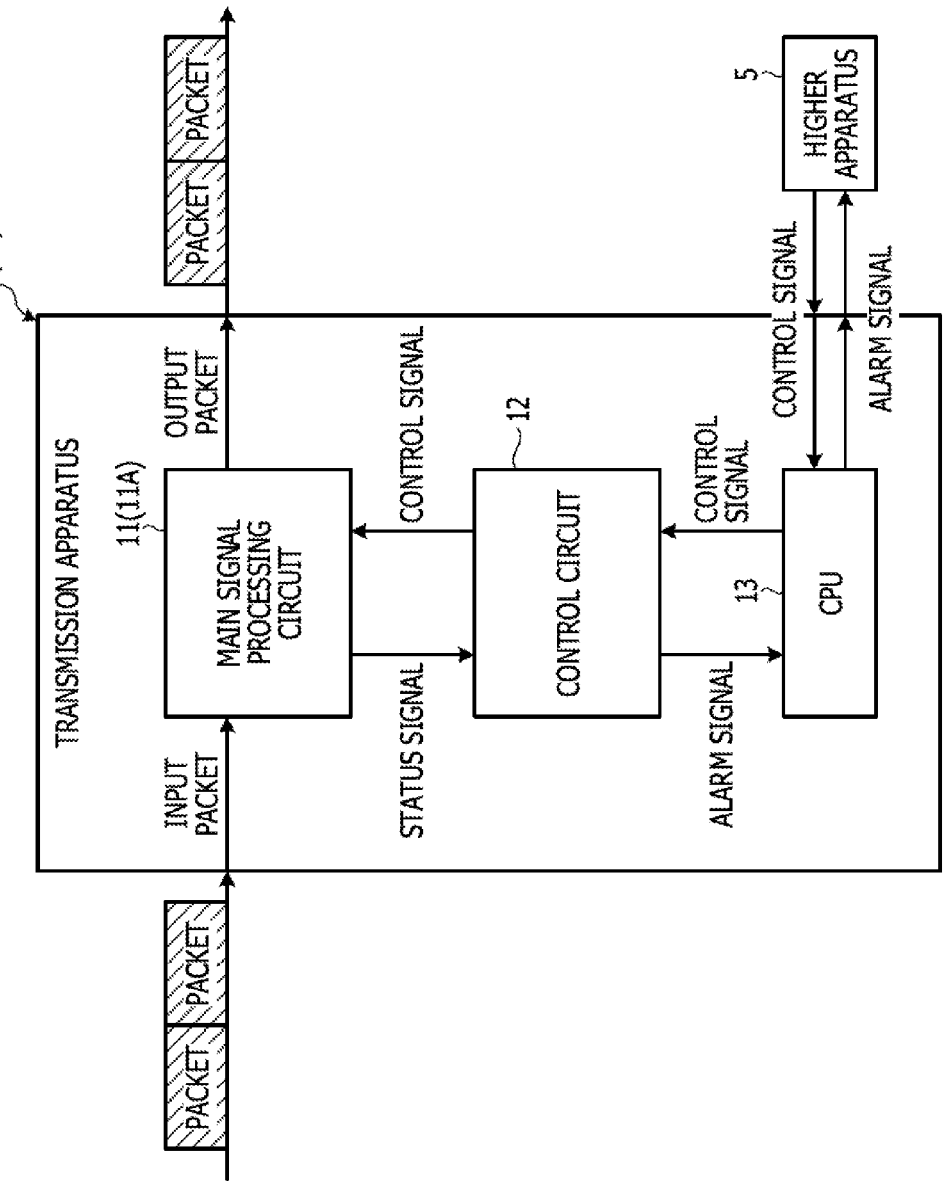
FIG. 2 illustrates an example of a configuration of a transmission apparatus.

FIG. 1 is an example of a transmission system 1 of a first embodiment. The transmission system 1 of FIG. 1 includes multiple transmission apparatuses 2. In the transmission system 1, the transmission apparatuses 2 are interconnected via a first network 3A. The transmission apparatus 2 is also connected to a second network 3B. The transmission apparatus 2 is a packet transmission apparatus, such as a layer 2 switch (L2SW) that connects to each terminal device 4. FIG. 2 illustrates an example of a configuration of the transmission apparatus 2. The transmission apparatus 2 of FIG. 2 includes a main signal processing circuit 11, a control circuit 12, and a central processing unit (CPU) 13. The main signal processing circuit 11 receives an input packet, performs main signal processing in response to header information in the input packet signal, and outputs a packet signal having undergone the main signal processing as an output packet. The main signal processing circuit 11 notifies the control circuit 12 of a status signal indicating the status of each packet signal.

The control circuit 12 sends an alarm signal to the CPU 13 if the control circuit 12 determines in accordance with the status signal of each packet from the main signal processing circuit 11 that a fault has occurred. Upon receiving the alarm signal, the CPU 13 notifies a higher apparatus 5 of the alarm signal. The higher apparatus 5 manages the transmission apparatus 2. The higher apparatus 5 notifies the transmission apparatus 2 of a control signal responsive to the alarm signal. The CPU 13 in the transmission apparatus 2 notifies the control circuit 12 of the control signal from the higher apparatus 5. The control circuit 12 notifies the main signal processing circuit 11 of the control signal. The main signal processing circuit 11 performs the main signal processing in response to the control signal.

Figure 3:
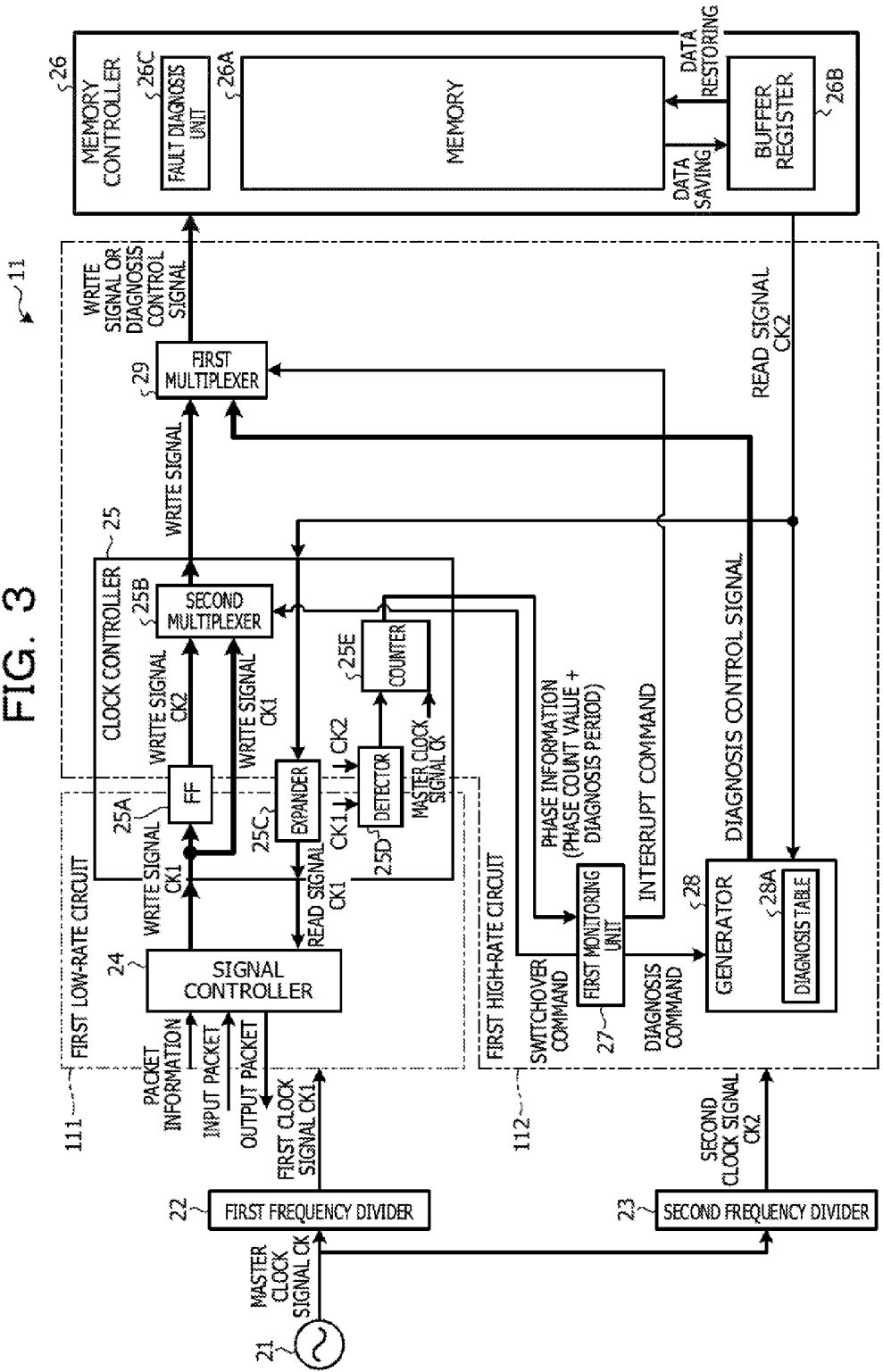
FIG. 3 illustrates an example of a configuration of a main signal processing circuit of the first embodiment.
Figure 4:
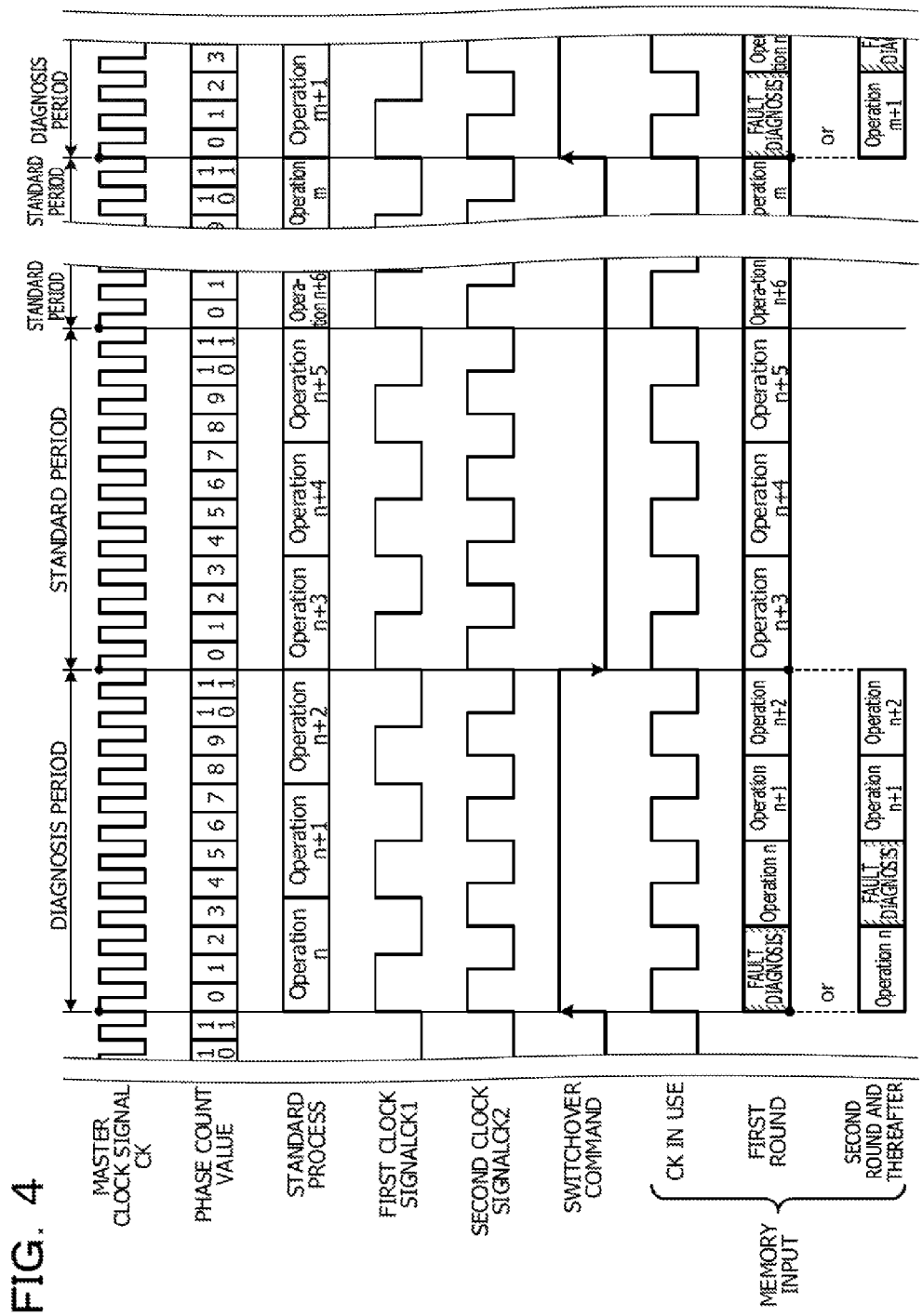
FIG. 4 illustrates an example of a timing diagram illustrating the timing of each signal related to a standard period and a diagnosis period of the first embodiment.

FIG. 3 illustrates an example of a configuration of the main signal processing circuit 11 of the first embodiment. FIG. 4 illustrates an example of a timing diagram illustrating the timing of signals related to a standard period and a diagnosis period of the first embodiment. The main signal processing circuit 11 of FIG. 3 includes a master clock generator 21, a first frequency divider 22, a second frequency divider 23, a signal controller 24, a clock controller 25, a memory controller 26, a first monitoring unit 27, a generator 28, and a first multiplexer 29.

The master clock generator 21 generates a master clock signal CK. The first frequency divider 22 generates a first clock signal CK1 by frequency-dividing the master clock signal CK through a divide-by-3 operation as illustrated in FIG. 4. The second frequency divider 23 generates a second clock signal CK2 by frequency-dividing the master clock signal CK through a divide-by-4 operation as illustrated in FIG. 4. The second clock signal CK2 is higher in rate than the first clock signal CK1. The signal controller 24 may be transceiver that transmits and receives a packet signal at the timing of the first clock signal CK1, for example. The signal controller 24 generates a write signal at the timing of the first clock signal CK1 to write received data on a memory 26A in the memory controller 26. In response to header information of the packet signal, the signal controller 24 accesses the memory 26A. The write signal includes a control signal to write on the memory 26A in response to the first clock signal CK1 or the second clock signal CK2, and a data signal of the packet. With reference to FIG. 3, the write signal including the control signal (write control signal) and the data signal are represented by heavy lines as illustrated in FIG. 3.

The memory controller 26 includes the memory 26A, buffer register 26B, and fault diagnosis unit 26C, and controls the memory 26A and the buffer register 26B. The memory 26A stores a received packet signal. The buffer register 26B is an area that saves data from a target address for a fault diagnosis on the memory 26A when the fault diagnosis to be described below is performed. The memory controller 26 writes data on the memory 26A in response to the write signal. The memory controller 26 reads data (a read signal) from the memory 26A. The read signal is a data signal to be read from the memory.

In response to a diagnosis control signal, the fault diagnosis unit 26C performs each of four operations including a save operation, an inversion value write operation, an inversion value read operation, and a restore operation. The diagnosis control signals include a control signal for the fault diagnosis, and a data signal for diagnosis data, and are thus illustrated as heavy lines as illustrated in FIG. 3. The fault diagnosis to be performed on a single target address may include the save operation, the inversion value write operation, the inversion value read operation, and the restore operation. In the save operation, the data at the target address of the fault diagnosis in the memory 26A is read, and the read data is then saved on the buffer register 26B. In the inversion value write operation, the inversion value of the data at the target address is written at the target address. In the inversion value read operation, the data written at the target address is read, and the read results are determined. In the restore operation, the data at the target address saved on the buffer register 26B is written at the target address of the memory 26A for restoration.

The clock controller 25 switches between the first clock signal CK1 and the second clock signal CK2 according to which the write signal or the read signal is driven. The clock controller 25 includes a flipflop (FF) 25A, a second multiplexer 25B, an expander 25C, a detector 25D, and a counter 25E. The FF 25A swatches the clock signal of the write signal from the first clock signal CK1 to the second clock signal CK2. The second multiplexer 25B outputs the write signal having the timing of the first clock signal CK1 or the output of the FF 25A, namely, the write signal having the timing of the second clock signal CK2. In response to a high (H)-level switchover command from the first monitoring unit 27 as illustrated in FIG. 4, the second multiplexer 25B switches the output signal thereof from the write signal having the timing of the first clock signal CK1 to the write signal having the timing of the second clock signal CK2. In response to a low (L)-level switchover command from the first monitoring unit 27 as illustrated in FIG. 4, the second multiplexer 25B switches the output signal thereof from the write signal having the timing of the second clock signal CK2 to the write signal having the timing of the first clock signal CK1.

The expander 25C expands the read signal having the timing of the second clock signal CK2 read from the memory 26A to the read signal having the timing of the first clock signal CK1. The expander 25C outputs the expanded read signal having the timing of the first clock signal CK1 to the signal controller 24. The detector 25D detects a timing at which a rising edge of each clock pulse of the first clock signal CK1 matches a rising edge of each clock pulse of the second clock signal CK2. For convenience of explanation, the matching timing may now occur every 12 clock pulse periods of the master clock signal CK. The counter 25E consecutively counts the master clock signal CK as a phase count value from 0 through 11 as illustrated in FIG. 4. The counter 25E thus counts only the least common multiple of the dividing numbers of the first frequency divider 22 and the second frequency divider 23. The counter 25E resets the phase count value to "0" at a timing at which a rising edge of a clock pulse of the first clock signal CK1 matches a rising edge of a clock pulse of the second clock signal CK2, namely, at the timing of the 12-th clock pulse of the master clock signal CK, and then resumes the counting operation of the phase count value.

The transmission apparatus 2 cycles through a standard period and a diagnosis period by 12 clock pulses of the master clock signal CK. More specifically, the transmission apparatus 2 cycles through one diagnosis period every two standard periods. For example, after cycling through two standard periods, the transmission apparatus 2 cycles through one diagnosis period. After that diagnosis period, the transmission apparatus 2 cycles through two standard periods. In this way, the transmission apparatus 2 repeats a cycle of two standard periods and one diagnosis period. During the standard period, a standard process is performed during three clock pulse period of the first clock signal CK1. During the diagnosis period, the standard process is performed during three clock pulse period of the second clock signal CK2 and the diagnosis process is performed during one clock pulse period of the second clock signal CK2. The first monitoring unit 27 monitors the phase count value from the counter 25E and notifies the generator 28 of a diagnosis command in response to a start timing of the diagnosis period.

The generator 28 generates diagnosis control signals in response to the diagnosis command, and outputs a generated diagnosis control signal to the first multiplexer 29. The diagnosis control signals include four types of signals. More specifically, the diagnosis control signals include a signal for the save operation as a first fault diagnosis, a signal for the inversion signal write operation as a second fault diagnosis, a signal for the inversion signal read operation as a third fault diagnosis, and a signal for the restore operation as a fourth fault diagnosis. The generator 28 includes a diagnosis table 28A, and stores on the diagnosis table 28A a target address and a current diagnosis status at the target address on the memory 26A. The diagnosis status refers to a progress count of the fault diagnosis N=1 through 4. For example, if the save operation is performed as the first fault diagnosis, the progress count N of the current diagnosis status is "1". If the inversion value write operation is performed as the second fault diagnosis, the progress count N of the current diagnosis status is "2". If the inversion value read operation is performed as the third fault diagnosis, the progress count N of the current diagnosis status is "3". If the restore operation is performed as the fourth fault diagnosis, the progress count N of the current diagnosis status is "4".

The first monitoring unit 27 notifies the first multiplexer 29 of an H-level interrupt command in response to a diagnosis enabled timing of the diagnosis period. The diagnosis enabled timing is a timing at which the fault diagnosis is performed within the diagnosis period. The first monitoring unit 27 monitors the phase count value of the counter 25E. In response to the H-level interrupt command, the first multiplexer 29 switches the output signal thereof from the write signal to the diagnosis control signal and then outputs the diagnosis control signal to the memory controller 26. The first multiplexer 29 switches between the write signal having the timing of the first clock signal CK1 and the write signal having the timing of the second clock signal CK2, and stretches over the time axis the write signal having the timing of the second clock signal CK2 that is driven at a higher rate in the time domain. This cuts down on power consumption involved in the use of the high-rate second clock signal CK2. The first multiplexer 29 switches to the write signal from the diagnosis control signal in response to an L-level interrupt command and outputs the write signal to the memory controller 26.

The first monitoring unit 27 outputs an H-level switchover command to the second multiplexer 25B at a start timing of the diagnosis period. In response to the H-level switchover command, the second multiplexer 25B switches the output signal thereof from the write signal having the timing of the first clock signal CK1 to the write signal having the timing of the second clock signal CK2, and then outputs the write signal having the timing of the second clock signal CK2 to the first multiplexer 29. In response to an L-level switchover command, the second multiplexer 25B switches the output signal thereof from the write signal having the timing of the first clock signal CK2 to the write signal having the timing of the second clock signal CK1, and then outputs the write signal having the timing of the second clock signal CK1 to the first multiplexer 29.

The first monitoring unit 27 performs the fault diagnosis at the diagnosis enabled timing within the diagnosis period, for example, at a first timing of the second clock signal CK2 within the diagnosis period or at a second timing of the second clock signal CK2 within the diagnosis period. As a result, the fault diagnosis is thus performed without latency in memory control. The clock controller 25, the first monitoring unit 27, and the generator 28 form a diagnosis controller that instructs the fault diagnosis unit 26C to perform the fault diagnosis at the diagnosis enabled timing that is a write idle time duration to the memory 26A.

Upon detecting the diagnosis control signal for the save operation from the first multiplexer 29, the fault diagnosis unit 26C performs the save operation to the data at the target address on the memory 26A. Upon detecting the diagnosis control signal for the inversion value write operation, the fault diagnosis unit 26C performs the inversion value write operation to the data at the target address on the memory 26A. Upon detecting the diagnosis control signal for the inversion value read operation, the fault diagnosis unit 26C performs the inversion value read operation to the data at the target address on the memory 26A. Upon detecting the diagnosis control signal for the restore operation, the fault diagnosis unit 26C performs the restore operation to the data at the target address on the memory 26A.

The signal controller 24 and part of the clock controller 25 form a first low-rate circuit 111 that operates at the timing of the first clock signal CK1. The first monitoring unit 27, the generator 28, the first multiplexer 29, and part of the clock controller 25 form a first high-rate circuit 112 that operates at the timing of the second clock signal CK2. The second multiplexer 25B and the counter 25E in the clock controller 25 operate at the timing of the second clock signal CK2. The memory controller 26 operates at the timing of the first clock signal CK1 or the second clock signal CK2.

The first diagnosis period of FIG. 4 starts at the timing of the second clock signal CK2, and the fault diagnosis starts at the start timing of a first clock pulse of the second clock signal CK2 within the diagnosis period. The diagnosis control signal for one fault diagnosis is generated at the start timing of a first clock pulse within the diagnosis period. The standard process is performed at the start timing at the second clock pulse of the second clock signal CK2 within the diagnosis period, the standard process is performed at the start timing at the third clock pulse of the second clock signal CK2, and the standard process is performed at the start timing at the fourth clock pulse of the second clock signal CK2, and then the diagnosis period ends. In the second diagnosis period and subsequent diagnosis periods, the fault diagnosis is performed at the start timing of the second clock pulse of the second clock signal CK2 within the diagnosis period. The standard process is performed at the timings of the first clock pulse, the third clock pulse, and the fourth clock pulse. The standard period of FIG. 4 starts in response to the first clock signal CK1, and the standard process is respectively performed in response to the first through third clock pulses of the first clock signal CK1 within the standard period.

Figure 5A:
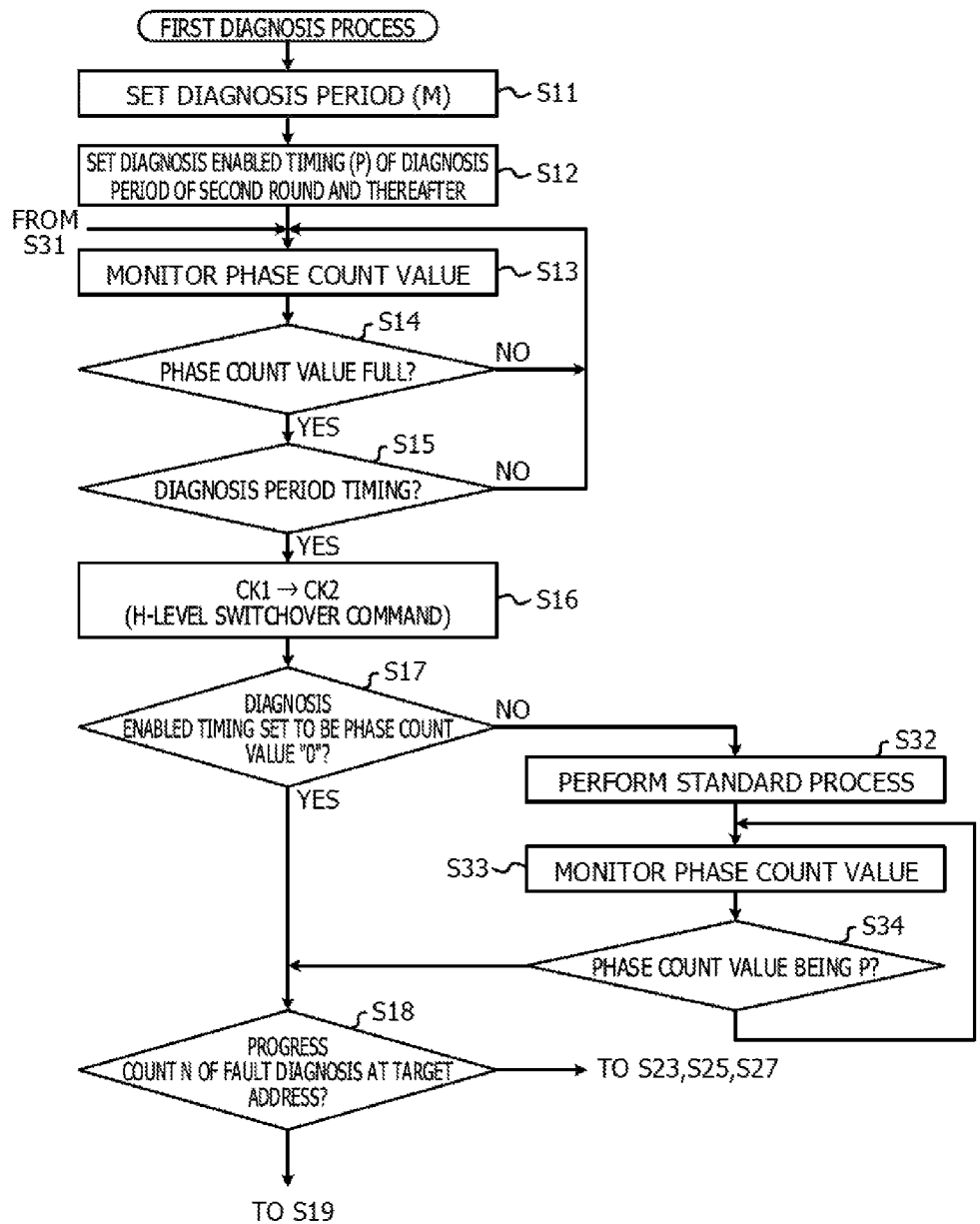
FIGS. 5A and 5B are flowcharts illustrating an example of an operation of the main signal processing circuit related to a first diagnosis process.
Figure 5B:
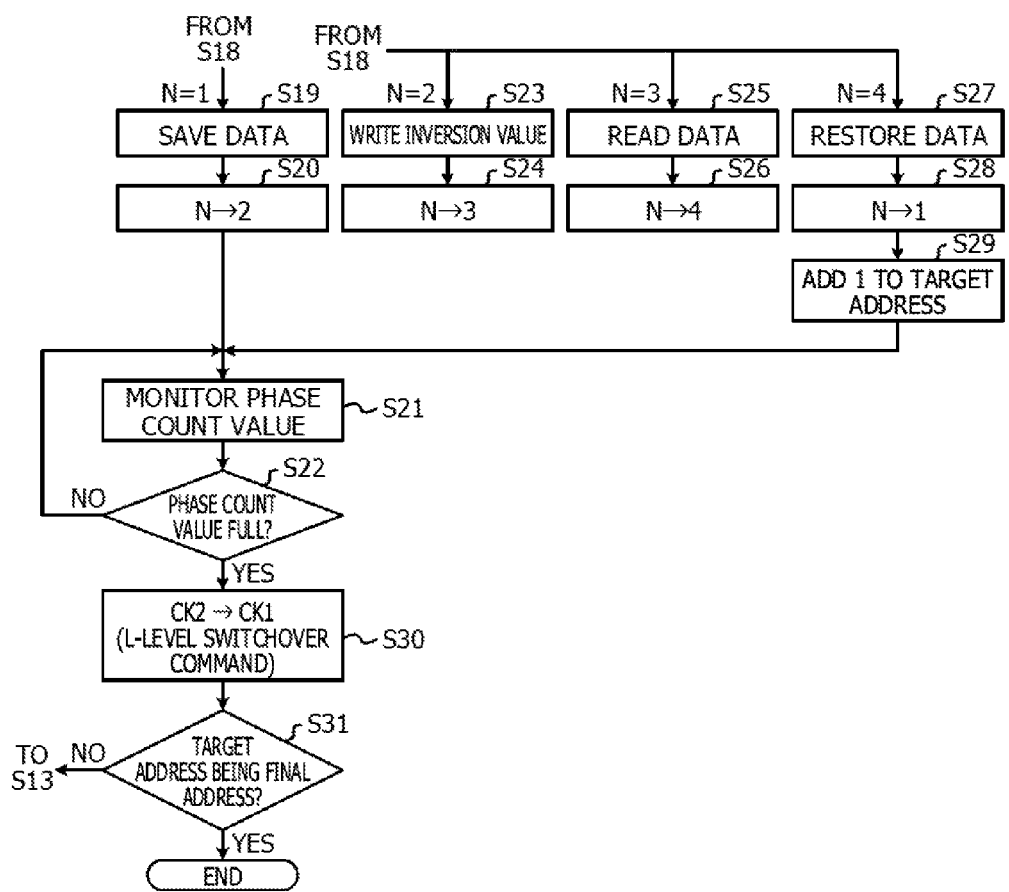

The operation of the transmission system 1 of the first embodiment is described below. FIGS. 5A and 5B are flowcharts illustrating an example of the operation of the main signal processing circuit 11 related to a first diagnosis process. The first diagnosis process of FIGS. 5A and 5B is performed during an idle time duration within the diagnosis period in response to the start timing of the diagnosis period, for example, at the diagnosis enabled timing based on a write pause period.

The first monitoring unit 27 in the main signal processing circuit 11 sets the diagnosis period (M) (S11). The diagnosis period occurs once every two standard periods. The first monitoring unit 27 sets the diagnosis enabled timing (P) of the second diagnosis period and subsequent diagnosis periods (S12). The diagnosis enabled timing of the first diagnosis period is the start timing of a first clock pulse of the second clock signal CK2. The diagnosis execution timing of the second diagnosis period and subsequent diagnosis periods is the start timing of the second clock pulse of the second clock signal CK2.

The first monitoring unit 27 monitors the phase count value (S13), and determines whether the phase count value is full (S14). The phase shift count falls within a range of from 0 through 11. The full count value is "11".

If the phase count value is full, in other words, the phase count value is "11" (yes branch from S14), the first monitoring unit 27 determines whether it is the start timing of the diagnosis period (S15). If it is the start timing of the diagnosis period (yes branch from S15), the first monitoring unit 27 notifies the clock controller 25 of the H-level switchover command to switch from the first clock signal CK1 to the second clock signal CK2 (S16). As a result, the second multiplexer 25B in the clock controller 25 changes to and outputs the write signal of the second clock signal CK2 in response to the H-level switchover command.

The first monitoring unit 27 determines whether the diagnosis enabled timing within the diagnosis period has been set to be "0" (S17). The diagnosis enabled timing of the first diagnosis period is set to be a phase count value of "0". The diagnosis enabled timing of the second diagnosis period and subsequent diagnosis periods is set to be a phase count value of "3" which corresponds to the start timing responsive to the second clock pulse. If the diagnosis enabled timing of the first diagnosis period has been set to be a phase count value of "0" (yes branch from S17), the generator 28 references the diagnosis table 28A, and determines a progress count N of the fault diagnosis at the target address (S18).

If the progress count N of the fault diagnosis is "1", the first monitoring unit 27 notifies the generator 28 of a diagnosis command of a save operation that saves the data stored at the target address on the memory 26A onto the buffer register 26B (S19). The generator 28 generates the diagnosis control signal for the save operation at the target address in response to the diagnosis command of the save operation. The generator 28 outputs the diagnosis control signal to the memory controller 26. The first monitoring unit 27 increments the progress count N of the fault diagnosis by +1. More specifically, the first monitoring unit 27 sets the progress count N to be "2" (S20), and monitors the phase count value (S21).

The first monitoring unit 27 determines whether the phase count value is full (S22). If the phase count value is not full (no branch from S22), the first monitoring unit 27 returns to S21 to monitor the phase count value.

If the progress count N of the fault diagnosis is 2, the first monitoring unit 27 notifies the generator 28 of the diagnosis command for the inversion value write operation to write an inversion value of the data at the target address (S23). The generator 28 generates the diagnosis control signal for the inversion value write operation at the target address in response to the diagnosis command for the inversion value write operation, and then outputs the diagnosis control signal to the memory controller 26. The first monitoring unit 27 increments the progress count N of the fault diagnosis by +1, in other words, sets the progress count N of the fault diagnosis to be 3 (S24), and then proceeds to S21 to monitor the phase count value.

If the progress count N of the fault diagnosis is 3, the first monitoring unit 27 notifies the generator 28 of the diagnosis command for the inversion value read operation to read an inversion value written at the target address (S25). The generator 28 generates the diagnosis control signal for the inversion value read operation at the target address in response to the diagnosis command for the inversion value read operation, and then outputs the diagnosis control signal to the memory controller 26. The first monitoring unit 27 increments the progress count N of the fault diagnosis by +1, in other words, sets the progress count N of the fault diagnosis to be 4 (S26), and then proceeds to S21 to monitor the phase count value.

If the progress count N of the fault diagnosis is 4, the first monitoring unit 27 notifies the generator 28 of the diagnosis command for the restore operation to write the data, saved on the buffer register 26B, onto the target address (S27). The generator 28 generates the diagnosis control signal for the restore operation at the target address in response to the diagnosis command for the restore operation, and then outputs the diagnosis control signal to the memory controller 26. As a result, the fault diagnosis unit 26C in the memory controller 26 performs the restore operation responsive to the diagnosis control signal, thereby completing the fault diagnosis at the target address. The first monitoring unit 27 resets the progress count N of the fault diagnosis to 1, in other words, sets the progress count N of the fault diagnosis to be 1 (S28), increments the progress count N of the fault diagnosis by +1 (S29), and then proceeds to S21 to monitor the phase count value.

If the phase count value is full (yes branch from S22), the first monitoring unit 27 determines that the diagnosis period has elapsed and then notifies the second multiplexer 25B of an L-level switchover command to shift from the write signal having the timing of the second clock signal CK2 to the write signal having the timing of the first clock signal CK1 (S30). In response to the L-level switchover command, the second multiplexer 25B switches the output signal thereof from the write signal having the timing of the second clock signal CK2 to the write signal having the timing of the first clock signal CK1, and then outputs the write signal having the timing of the first clock signal CK1. The first monitoring unit 27 determines whether the target address for the fault diagnosis is the final address in the memory 26A (S31). If the target address of the fault diagnosis is not the final address (no branch from S31), the first monitoring unit 27 returns to S13 to monitor the phase count value of the start timing of the next diagnosis period. If the target address of the fault diagnosis is the final address (yes branch from S31), the first monitoring unit 27 ends the process of FIGS. 5A and 5B.

If the diagnosis enabled timing has not been set to be a phase count value of "0" (no branch from S17), the first monitoring unit 27 performs the standard process (S32). After performing the standard process, the first monitoring unit 27 monitors the phase count value (S33), and determines whether the phase count value indicates the diagnosis enabled timing of the second or later diagnosis period (S34). If the phase count value indicates the diagnosis enabled timing of the second or later diagnosis period (yes branch from S34), the first monitoring unit 27 proceeds to S18 to determine the progress count N of the fault diagnosis. If the phase count value does not indicate the diagnosis enabled timing of the second or later diagnosis period (no branch from S34), the first monitoring unit 27 returns to S33 to monitor the phase count value. If the phase count value is not full (no branch from S14) or if it not the start timing of the fault diagnosis (no branch from S15), the first monitoring unit 27 returns to S13 to monitor the phase count value.

The main signal processing circuit 11 that performs the first diagnosis process of FIGS. 5A and 5B switches the timing of the write signal from the first clock signal CK1 to the second clock signal CK2 in response to the start timing of the diagnosis period, and performs the fault diagnosis at the diagnosis enabled timing that serves as an idle time duration within the diagnosis period. As a result, the fault diagnosis is performed even in the middle of the standard process.

The main signal processing circuit 11 performs the fault diagnosis on all addresses in the memory 26A by successively performing the fault diagnosis at each target address every diagnosis period. As a result, the main signal processing circuit 11 may complete the fault diagnosis on a single target address in the memory 26A every four diagnosis periods.

The transmission apparatus 2 of the first embodiment generates an idle time duration from a phase difference between the first clock signal CK1 and the second clock signal CK2, and performs the fault diagnosis at the diagnosis enabled timing during the idle time duration within the diagnosis period. Since a sufficient fault diagnosis is thus performed at all addresses in the memory 26A, a fault, if any, is reliably detected prior to the reading of error data of the signal controller 24. For example, if the memory 26A is configured redundantly, switching to a backup memory 26A is possible prior to the reading of the error data from an active memory 26A. The quality of the network provided by the transmission apparatus 2 is thus improved.

Since the first clock signal CK1 and the second clock signal CK2 are generated by frequency dividing the master clock signal CK, the transmission apparatus 2 is free from using individual clock generators, and is thus easy to mount.

The transmission apparatus 2 of the first embodiment is a synchronous type. In other words, the transmission apparatus 2 generates the first clock signal CK1 and the second clock signal CK2 from the master clock signal CK, with the first clock signal CK1 and the second clock signal CK2 synchronous with each other. An asynchronous transmission apparatus 2A with the first clock signal CK1 and the second clock signal CK2 asynchronous with each other is also possible. The transmission apparatus 2A is described as a second embodiment.

Second Embodiment

Figure 6:
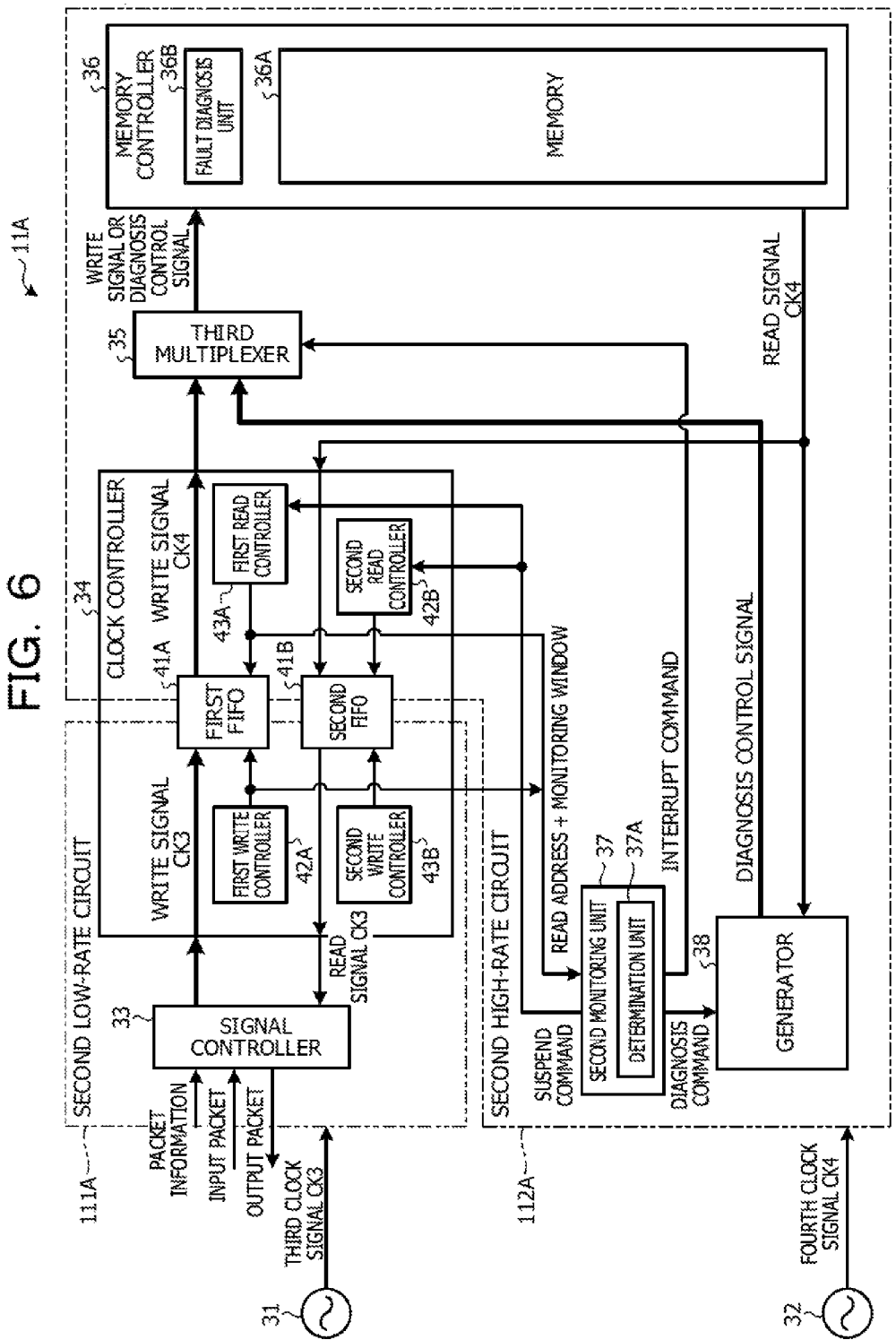
FIG. 6 illustrates an example of a configuration of a main signal processing circuit of a second embodiment.

FIG. 6 illustrates an example of a configuration of a main signal processing circuit 11A of the second embodiment. The main signal processing circuit 11A of FIG. 6 generates a third clock signal CK3 and a fourth clock signal CK4 asynchronous with the third clock signal CK3. The fourth clock signal CK4 is slighter higher in rate than the third clock signal CK3. The main signal processing circuit 11A of FIG. 6 includes a third clock generator 31, fourth clock generator 32, signal controller 33, clock controller 34, third multiplexer 35, memory controller 36, second monitoring unit 37, and generator 38.

The third clock generator 31 generates the third clock signal CK3. The fourth clock generator 32 generates the fourth clock signal CK4 that is asynchronous with and higher in rate than the third clock signal CK3. The signal controller 33 is a transceiver that transmits or receives a packet signal at the timing of the third clock signal CK3. The signal controller 33 is a signal processor that writes or reads a packet to or from the memory 36A in the memory controller 36.

The clock controller 34 includes a first FIFO 41A, a first write controller 42A, and a first read controller 43A. The clock controller 34 further includes a second FIFO 41B, a second write controller 42B, and a second read controller 43B. The clock controller 34 switches between the write signal having the timing of the third clock signal CK3 and the write signal having the timing of the fourth clock signal CK4. The write signal having the timing of the third clock signal CK3 includes a control signal of the third clock signal CK3 and a data signal of a packet signal. The write signal having the timing of the fourth clock signal CK4 includes a data signal and a control signal to write the data signal on the memory 36A at the timing of the fourth clock signal CK4. Referring to FIG. 6, the write signal including the control signal and the data signal is represented by heavy lines.

The second monitoring unit 37 monitors a phase difference between a read address and a write address on the first FIFO 41A. More specifically, the second monitoring unit 37 monitors the phase difference between the read address and the write address of the first FIFO 41A temporarily storing the write signal of the third clock signal CK3. The second monitoring unit 37 includes a determination unit 37A. The determination unit 37A determines whether the timing of a read address "1" on the first FIFO 41A has caught up with the timing of a write address "1" on the first FIFO 41A. If the timing of the read address "1" on the first FIFO 41A has caught up with the timing of the write address "1" on the first FIFO 41A, the determination unit 37A detects a phase monitoring window "1". A write operation is performed on the first FIFO 41A in response to the third clock signal CK3. A read operation is performed on the first FIFO 41A in response to the fourth clock signal CK4. A write operation is performed on the second FIFO 41B in response to the fourth clock signal CK4. A read operation is performed on the second FIFO 41B in response to the third clock signal CK3.

Upon detecting the monitoring window "1", the second monitoring unit 37 notifies the first read controller 43A of an H-level suspend command. In response to the H-level suspend command, the first read controller 43A suspends the reading of the first FIFO 41A during 3 clock pulse periods of the fourth clock signal CK4. Upon detecting the monitoring window "1", the second monitoring unit 37 notifies the generator 38 of the diagnosis command. In response to the diagnosis command, the generator 38 outputs the diagnosis control signal to the third multiplexer 35. The diagnosis control signals include three types of signals for a read operation as a first fault diagnosis, an inversion value write operation as a second fault diagnosis, an inversion value read operation as a third fault diagnosis. The diagnosis control signals include the control signal for the fault diagnosis and the data signal of the diagnosis data and are presented by heavy lines as illustrated in FIG. 6.

The third multiplexer 35 successively outputs to the memory controller 36 the diagnosis control signals for three clock pulses during the read suspension period of the first FIFO 41A. The memory controller 36 includes the memory 36A, and the fault diagnosis unit 36B, and controls the memory 36A. In response to the diagnosis control signal, the fault diagnosis unit 36B performs at the target address the read operation, the inversion value write operation, and the inversion value read operation. Upon completing the inversion value read operation, the fault diagnosis unit 36B completes the fault diagnosis at the target address. The fault diagnosis unit 36B increments the target address by +1, and performs the fault diagnosis on the next the diagnosis period.

The generator 38 outputs the diagnosis control signal to the third multiplexer 35 during a read suspension period of the first FIFO 41A. The read suspension period of the first FIFO 41A is 3 clock pulse periods of the fourth clock signal CK4 beginning with the detection timing of the monitoring window "1". More specifically, the generator 38 successively generates the three diagnosis control signals during the read suspension time, including the read operation, the inversion value write operation, and the inversion value read operation. Upon detecting the monitoring window "1", the second monitoring unit 37 notifies the third multiplexer 35 of an H-level interrupt command. In response to the detection of the H-level interrupt command, the third multiplexer 35 successively outputs the diagnosis control signals from the generator 38 to the memory controller 36. The fault diagnosis unit 36B in the memory controller 36 successively detects the diagnosis control signals for the read operation, the inversion value write operation, and the inversion value read operation during the read suspension period of the first FIFO 41A. The fault diagnosis unit 36B successively performs the fault diagnosis responsive to the diagnosis control signal.

The second monitoring unit 37 notifies the first read controller 43A of an L-level suspend command at the timing of the completion of the inversion value read operation for the fault diagnosis. The first read controller 43A resumes the read operation on the first FIFO 41A in response to the L-level suspend instruction. The second monitoring unit 37 notifies the third multiplexer 35 of the L-level interrupt command at the timing of the completion of the inversion value read operation for the fault diagnosis. Upon detecting the L-level interrupt command, the third multiplexer 35 outputs the write signal from the first FIFO 41A to the memory controller 36. The clock controller 34, the second monitoring unit 37, and the generator 38 form a diagnosis controller that instructs the fault diagnosis unit 36B to perform the fault diagnosis during the read suspension period of the first FIFO 41A that is a write idle period to the memory 36A.

The signal controller 33 and part of the clock controller 34 form a second low-rate circuit 111A that operates at the timing of the third clock signal CK3. The second monitoring unit 37, the generator 38, the third multiplexer 35, the memory controller 36, and part of the clock controller 34 form a second high-rate circuit 112A that operates at the timing of the fourth clock signal CK4. The first write controller 42A and the second read controller 43B in the clock controller 34 operate at the timing of the third clock signal CK3. The first read controller 43A and the second write controller 42B operate at the timing of the fourth clock signal CK4.

An interrupt period of the fault diagnosis is described below. Let T1 be the period of the third clock signal CK3, T2 the period of the fourth clock signal CK4, n1 the number of clock pulses of the third clock signal CK3, and n2 the number of clock pulses of the fourth clock signal CK4. If time to the occurrence of the next interrupt of the fault diagnosis is counted in the number of clock pulses of the third clock signal CK3, n1×T1 results. If the time to the occurrence of the next interrupt of the fault diagnosis is counted in the number of clock pulses of the fourth clock signal CK4, n2×T2 results. Equation (1) of n1×T1=n2×T2 thus holds.

The interrupt of fault diagnosis suspends the reading at a read address of the first FIFO 41A during 3 clock pulse periods of the fourth clock signal CK4. At the next interrupt of the fault diagnosis, the phase of the fourth clock signal CK4 catches up with the third clock signal CK3 by the read suspension period. For this reason, the clock pulse count n2 of the fourth clock signal CK4 is more than the count pulse count n1 of the third clock signal CK3 by 3 clock pulses. More specifically, equation (2) of n2=(n1+3) holds.

In view of equation (1) and equation (2), equation (3) of n2=3T1/(T1−T2) holds. A period T to perform the fault diagnosis is T=n2×T2=3T1×T2/(T1>T2).

Figure 7A:
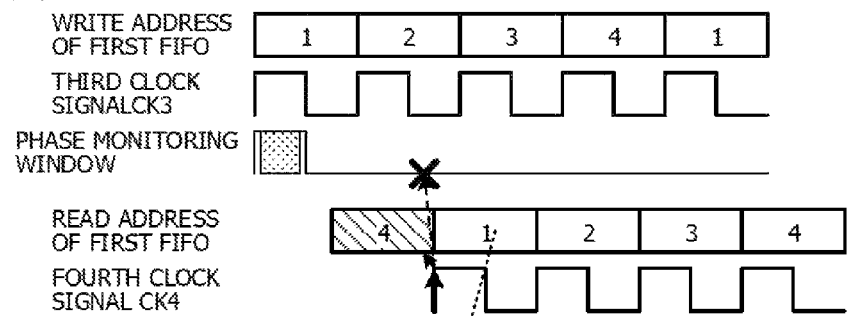
FIG. 7A through FIG. 7D illustrate examples of timing of each operation related to a fault diagnosis of the second embodiment.
Figure 7B:
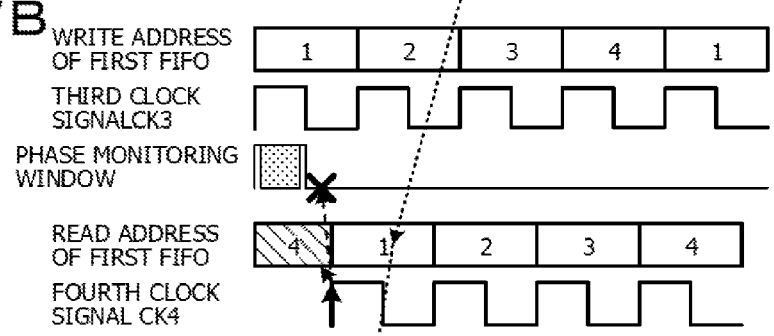
Figure 7C:
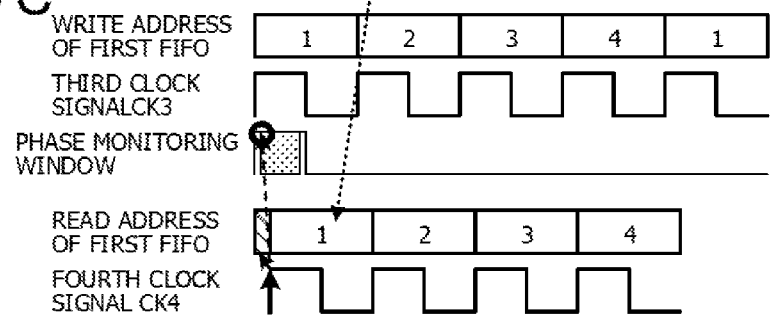
Figure 7D:
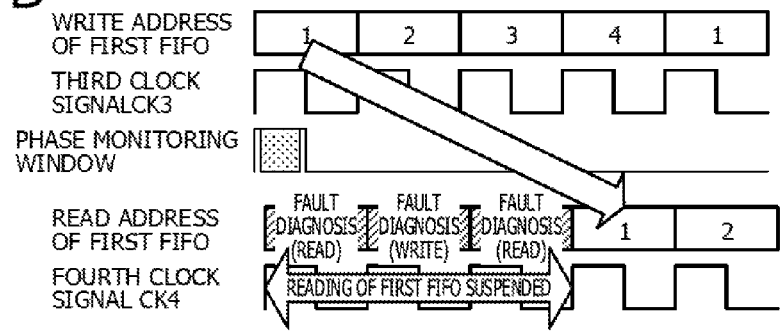

FIG. 7A, FIG. 7B, FIG. 7C, and FIG. 7D illustrate examples of process timings related to the fault diagnosis of the second embodiment. Addresses of the first FIFO 41A are "1" through "4". The first FIFO 41A is written at the timing of the third clock signal CK3 while being read at the timing of the fourth clock signal CK4. In the timing chart of FIG. 7A, the timing of a write address "1" of the first FIFO 41A is different from the timing of a read address "1" of the first FIFO 41A. In the timing chart of FIG. 7B, the fourth clock signal CK4 is higher in rate than the third clock signal CK3. For this reason, the timing of the read address "1" gradually approaches the timing of the write address "4". In the timing chart of FIG. 7C, the timing of the read address "1" falls within a half clock pulse period of the third clock signal CK3 of the timing of the write address. As a result, the read address "1" catches up with the write address "1", and the phase monitoring window becomes "1". At the timing of the detection of the phase monitoring window "1", the second monitoring unit 37 suspends the reading of the first FIFO 41A as illustrated in FIG. 7D. The read operation for the fault diagnosis is then performed at the read address timing "1". The inversion value write operation for the fault diagnosis is performed at the timing of the read address "2". The inversion value read operation for the fault diagnosis is performed at the timing of the read address "3". The read operation as the standard process at the read address "1" is performed at the timing of the read address "4".

Figure 8:
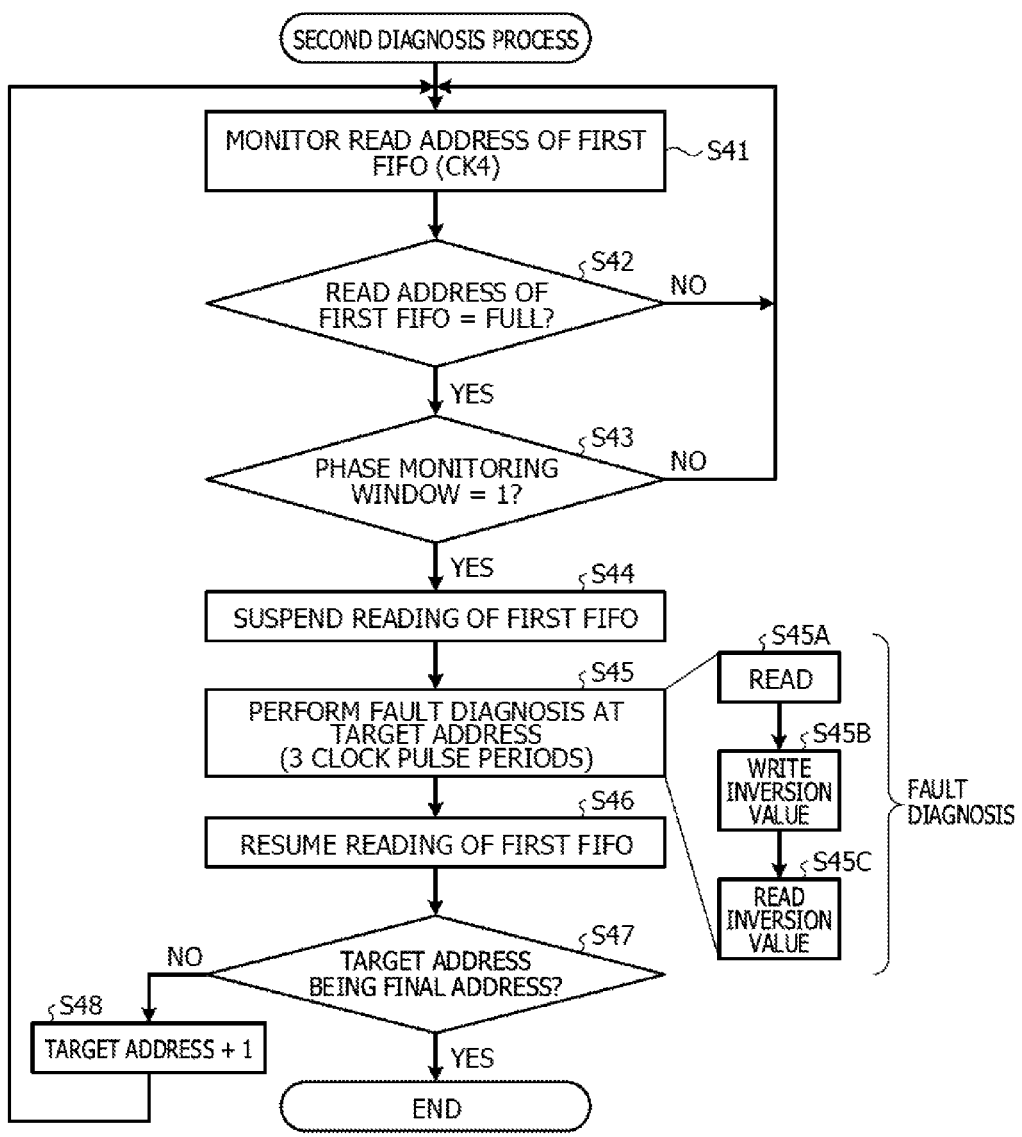
FIG. 8 illustrates an example of the main signal processing circuit related to a second diagnosis process.

The operation of the transmission system 1 of the second embodiment is described below. FIG. 8 is a flowchart illustrating an example of the main signal processing circuit 11A related to a second diagnosis process. In the second diagnosis process of FIG. 8, a read suspension period serving as an idle time duration is formed by suspending the reading of the first FIFO 41A when a phase monitoring window of "1" is detected, and the fault diagnosis is performed at the target address during the read suspension period.

Referring to FIG. 8, the second monitoring unit 37 monitors a read address of the fourth clock signal CK4 on the first FIFO 41A (S41). The second monitoring unit 37 determines whether the read address of the first FIFO 41A is full, namely, "4" (S42). If the read address of the first FIFO 41A is full (yes branch from S42), the second monitoring unit 37 determines whether the phase monitoring window is "1" (S43). The phase monitoring window is "1" while the clock pulse at the write address "1" of the first FIFO 41A is high. If a first read address "1" overlaps the phase monitoring window, it is determined that the read address "1" of the first FIFO 41A has caught up with the write address "1" of the first FIFO 41A.

If the phase monitoring window is "1" (yes branch from S43), the second monitoring unit 37 notifies the first read controller 43A of the H-level suspend command, the generator 38 of the diagnosis command, and the third multiplexer 35 of the H-level interrupt command. As a result, the first read controller 43A suspends the reading of the first FIFO 41A in response to the H-level suspend command (S44). The generator 38 generates the diagnosis control signal in response to the diagnosis command. The third multiplexer 35 outputs the diagnosis control signal to the memory controller 36 in response to the H-level interrupt command.

The fault diagnosis unit 36B in the memory controller 36 performs the fault diagnosis at the target address on the memory 36A in response to the diagnosis control signal from the third multiplexer 35 (S45). During the read suspension period corresponding to three clock periods of the fourth clock signal CK4, the fault diagnosis unit 36B performs the fault diagnosis including the read operation (S45A), the inversion value write operation (S45B), and the inversion value read operation (S45C). As a result, the fault diagnosis at a single target address is now complete.

Subsequent to the fault diagnosis at the target address, the second monitoring unit 37 notifies the first read controller 43A of the L-level suspend command, and the third multiplexer 35 of the L-level interrupt command (S46). In response to the L-level suspend command, the first read controller 43A resumes the reading of the first FIFO 41A. In response to the L-level interrupt command, the third multiplexer 35 outputs the write signal from the first FIFO 41A to the memory controller 36. The second monitoring unit 37 determines whether the target address for the fault diagnosis is the final address in the memory 36A (S47).

If the target address for the fault diagnosis is not the final address (no branch from S47), the second monitoring unit 37 increments the target address by +1 (S48). The second monitoring unit 37 then returns to S41 to monitor the read address of the first FIFO 41A. If the target address for the fault diagnosis is the final address (yes branch from S47), the second monitoring unit 37 completes the second diagnosis process of FIG. 8.

If the read address of the first FIFO 41A is not full (no branch from S42), the second monitoring unit 37 returns to S41 to monitor the read address of the first FIFO 41A. If the phase monitoring window is not "1" (no branch from S43), the second monitoring unit 37 returns S41 to monitor the read address of the first FIFO 41A.

The main signal processing circuit 11A configured to perform the second diagnosis process suspends the reading of the first FIFO 41A at the timing when the phase monitoring window of "1" is detected. The main signal processing circuit 11A performs the fault diagnosis of three clock periods at the target address during the read suspension period. As a result, the fault diagnosis is performed at the target address while the standard process is in operation.

After the fault diagnosis at the target address during the read suspension period, the main signal processing circuit 11A resumes the reading of the first FIFO 41A, and performs the standard process in operation. As a result, the standard process in operation is resumed after completion of the fault diagnosis.

The transmission apparatus 2A of the second embodiment suspends the reading of the first FIFO 41A at the timing when the read address "1" of the first FIFO 41A has caught up with the write address "1" of the first FIFO 41A. The transmission apparatus 2A performs the fault diagnosis during the read suspension period. As a result, the transmission apparatus 2A may perform the fault diagnosis even while the standard process is in operation.

In the transmission apparatus 2A of the second embodiment, the fourth clock signal CK4 is slightly higher in rate than the third clock signal CK3. For this reason, the transmission apparatus 2A restrains an increase in the power consumption responsive to an increase in the operation speed, and the fault diagnosis is performed during the idle time duration caused by the phase difference between the third clock signal CK3 and the fourth clock signal CK4.

Even when asynchronous high-rate clock signals are used, the transmission apparatus 2A restrains an increase in power consumption caused by the fourth clock signal CK4 by controlling the frequency of use of the fourth clock signal CK4.

Third Embodiment

In a third embodiment, a statistics counting function is applied to the standard process of the transmission apparatus 2 of the first embodiment. Elements identical to those in the transmission apparatus 2 of the first embodiment are designated with the same reference numerals, and the discussion of the configuration and operation thereof is omitted herein. The statistics counting function counts the number of packet signals, for example.

When the statistics counting function is performed, the signal controller 24 performs the statistics counting function that reads or writes a count of received packet signals on the memory 26A in the memory controller 26. In the statistics counting function, the signal controller 24 repeats a read operation to read from the memory 26A a previous count of received packet signals, and a write operation to increment the previous count read by +1 as a current count of received packet and write the current count on the memory 26A.

Figure 9:
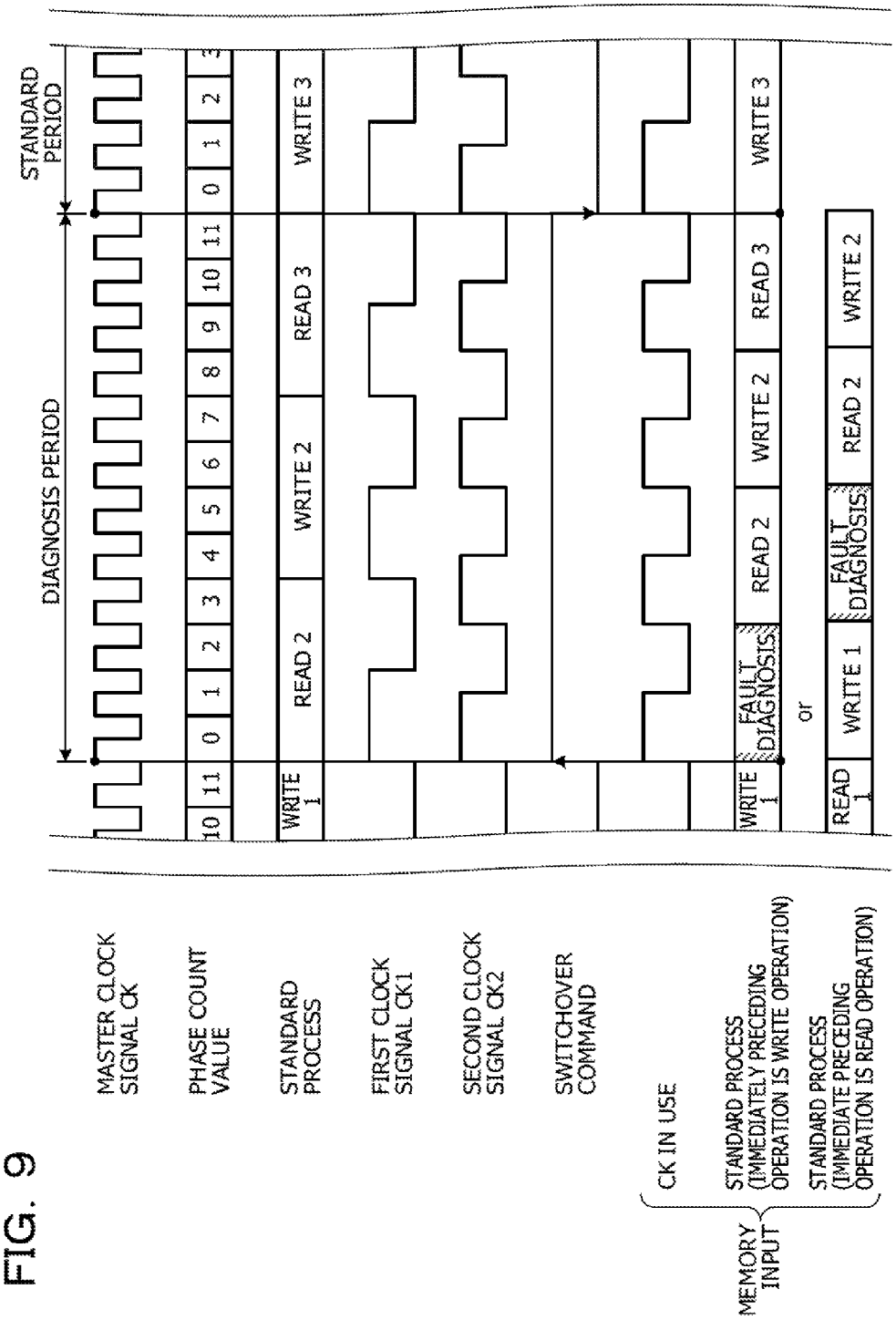
FIG. 9 illustrates an example of timings of signals related to the standard period and the diagnosis period of a third embodiment.

FIG. 9 illustrates an example of timings of signals related to the standard period and the diagnosis period of the third embodiment. If the operation immediately preceding the diagnosis enabled timing within the diagnosis period is a write operation as illustrated in FIG. 9, the first monitoring unit 27 inserts the fault diagnosis at the diagnosis enabled timing. At the timing of the completion of the fault diagnosis, the first monitoring unit 27 performs the read operation for the statistics counting function.

If the operation immediately preceding the diagnosis enabled timing within the diagnosis period with respect to the start timing of the diagnosis period is a read operation, the first monitoring unit 27 performs a write operation with a higher priority in succession to the read operation at the diagnosis enabled timing, and then inserts the fault diagnosis subsequent to the write operation. The statistics counting function is thus free not only from an interrupt between a series of operations including the read operation and the write operation, and but also from an operation to store the count obtained in the read operation. The read operation of the statistics counting function is performed at a timing subsequent to the fault diagnosis.

Figure 10A:
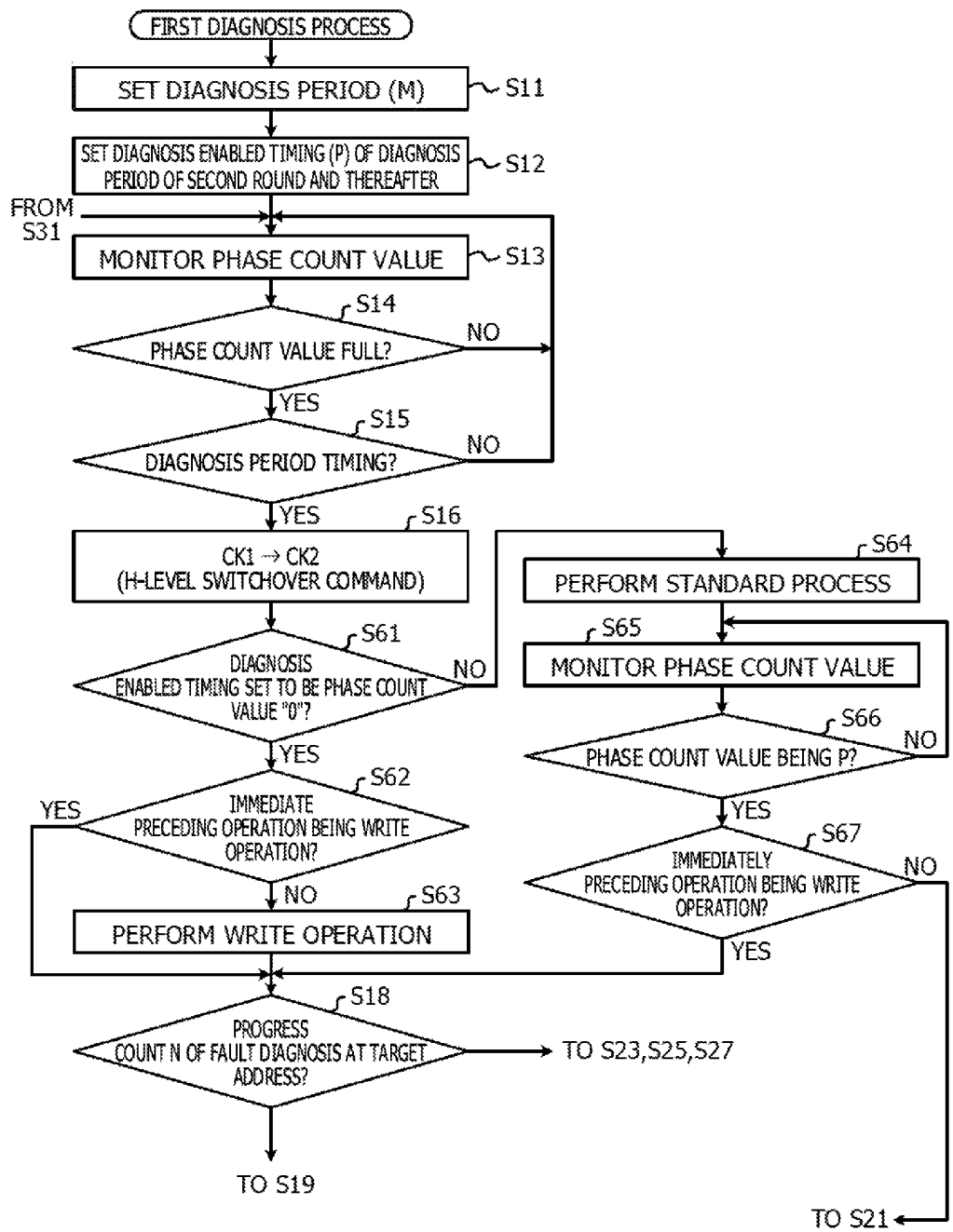
FIGS. 10A and 10B are flowcharts illustrating an example of an operation of a main signal processing circuit of a third diagnosis process.
Figure 10B:
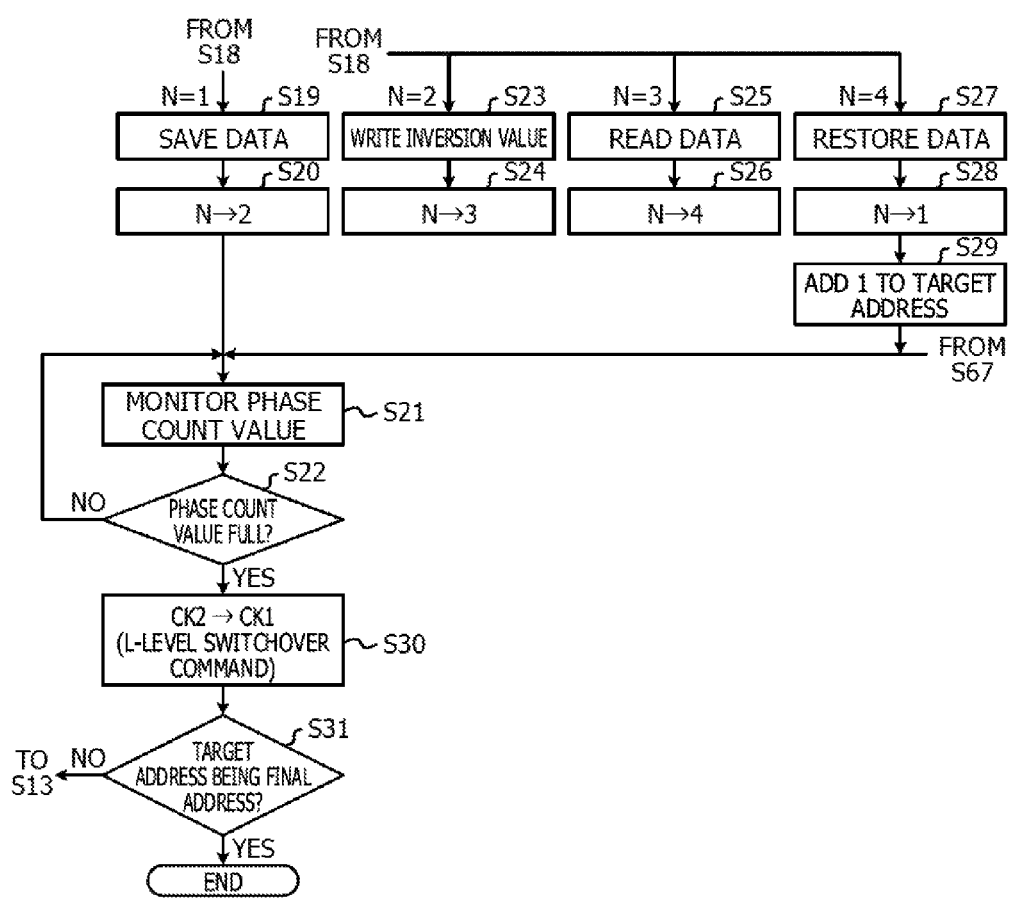

The operation of the transmission system 1 of the third embodiment is described below. FIGS. 10A and 10B are flowcharts illustrating an example of the operation of the main signal processing circuit 11 of a third diagnosis process. In the statistics counting function, the third diagnosis process performs the fault diagnosis at the diagnosis enabled timing in an idle time duration within the diagnosis period in response to the start timing of the diagnosis period.

If it is the start timing of the diagnosis period (yes branch from S15), the first monitoring unit 27 notifies the second multiplexer 25B of the H-level switchover command (S16). The second multiplexer 25B switches to the write signal having the timing of the second clock signal CK2 in response to the H-level switchover command, and then outputs he write signal having the timing of the second clock signal CK2.

The first monitoring unit 27 determines whether the diagnosis enabled timing within the diagnosis period has been set to be a phase count value of "0" (S61). If the diagnosis enabled timing has been set to be a phase count value of "0" (yes branch from S61), the first monitoring unit 27 determines whether the operation immediately preceding the diagnosis enabled timing is a write operation (S62). If the operation immediately preceding the diagnosis enabled timing is a write operation (yes branch from S62), the first monitoring unit 27 proceeds to S18 to determine the progress count N of the fault diagnosis at the target address.

If the immediately preceding operation is not a write operation (no branch from S62), the immediately preceding operation is a read operation. The first monitoring unit 27 performs a write operation in succession to the read operation related to the statistics counting function (S63). The first monitoring unit 27 then proceeds to S18 to determine the progress count N of the fault diagnosis at the target address.

If the diagnosis enabled timing within the diagnosis period has not been set to be a phase count value of "0" (no branch from S61), the first monitoring unit 27 performs the standard process (S64). The first monitoring unit 27 monitors the phase count value (S65). The first monitoring unit 27 determines whether the phase count value is the diagnosis enabled timing within the second diagnosis period or subsequent diagnosis period (S66). If the phase count value is the diagnosis enabled timing within the second diagnosis period or subsequent diagnosis period (yes branch from S66), the first monitoring unit 27 determines whether the operation immediately preceding the diagnosis enabled timing is a write operation (S67).

If the operation immediately preceding the diagnosis enabled timing is a write operation (yes branch from S67), the first monitoring unit 27 then proceeds to S18 to determine the progress count N of the fault diagnosis at the target address. If the immediately preceding operation is not a write operation (no branch from S67), the fault diagnosis is given up during this period. The first monitoring unit 27 then proceeds to S21 to monitor the phase count value. If the phase count value is not the diagnosis enabled timing within the second or subsequent diagnosis period (no branch from S66), the first monitoring unit 27 returns to S65 to monitor the phase count value.

The main signal processing circuit 11 performing the third diagnosis process changes the clock signal of the write signal from the first clock signal CK1 to the second clock signal CK2 in response to the start timing of the diagnosis period during the execution of the statistics counting function. The main signal processing circuit 11 performs the fault diagnosis at the diagnosis enabled timing during the idle time duration within the diagnosis period. The fault diagnosis is executed even while the statistics counting function is active.

If the operation immediately preceding the diagnosis enabled timing within the diagnosis period is a read operation of the statistics counting function, the main signal processing circuit 11 performs a write operation in succession to the read operation, and then performs the fault diagnosis subsequent to that write operation. As a result, the transmission apparatus 2 performs the fault diagnosis while performing the statistics counting function smoothly.

In response to the diagnosis enabled timing within the diagnosis period, the main signal processing circuit 11 performs the fault diagnosis if the operation immediately preceding the diagnosis enabled timing within the diagnosis period is a read operation of the statistics counting function. The fault diagnosis is performed while the statistics counting function is performed.

Fourth Embodiment

Figure 11A:
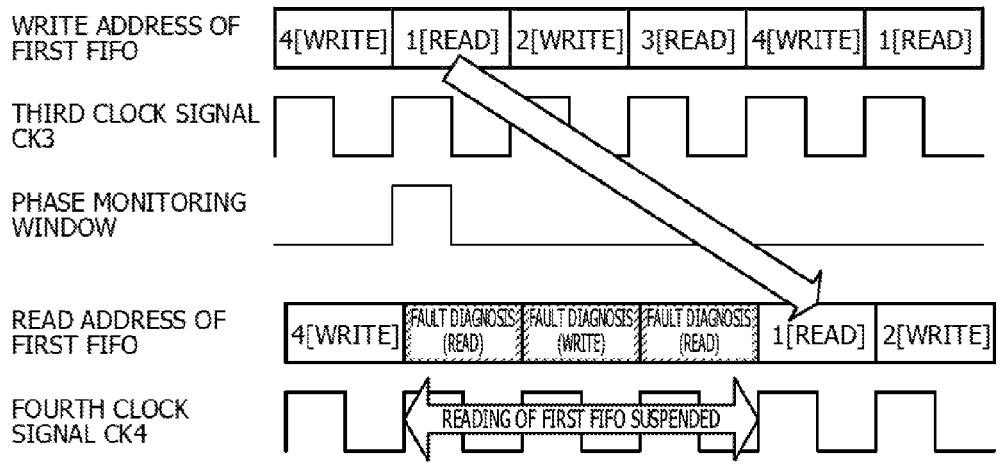
FIG. 11A illustrates an example of timings of operations related to a fault diagnosis of a fourth embodiment (when an immediately preceding operation is a write operation)
Figure 11B:
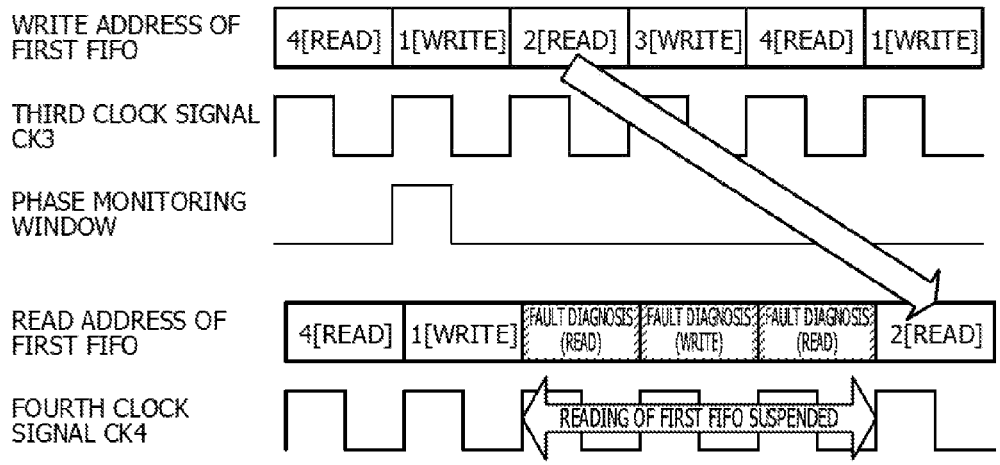
FIG. 11B illustrates an example of timings of operations related to a fault diagnosis of the fourth embodiment (when an immediately preceding operation is a read operation)

In a fourth embodiment, the statistics counting function is performed as the standard process of the transmission apparatus 2A of the second embodiment. Elements identical to those in the transmission apparatus 2A of the second embodiment are designated with the same reference numerals and the discussion of the configuration and operation thereof is omitted herein. FIG. 11A illustrates an example of timings of operations related to the fault diagnosis of the fourth embodiment (when the immediately preceding operation is a write operation). FIG. 11B illustrates an example of timings of operations related to the fault diagnosis of the fourth embodiment (when the immediately preceding operation is a read operation).

The signal controller 33 repeats the read operation and the write operation while the statistics counting function is performed. If the operation immediately preceding the read address "1" of the first FIFO 41A when the phase monitoring window "1" is detected is a write operation as illustrated in FIG. 11A, the second monitoring unit 37 suspends the reading operation of the first FIFO 41A. During the read suspension period, the second monitoring unit 37 causes the fault diagnosis unit 36B in the memory controller 36 to perform the fault diagnosis at the target address. After the completion of the fault diagnosis at the target address, the second monitoring unit 37 resumes the read operation of the statistics counting function.

If the operation immediately preceding the read address "1" of the first FIFO 41A when the phase monitoring window "1" is detected is a read operation as illustrated in FIG. 11B, the second monitoring unit 37 suspends the reading operation of the first FIFO 41A after a write operation is performed in succession to the read operation. During the read suspension period, the second monitoring unit 37 causes the memory controller 36 to perform the fault diagnosis. After the completion of the fault diagnosis at the target address, the second monitoring unit 37 resumes the read operation of the statistics counting function.

Figure 12:
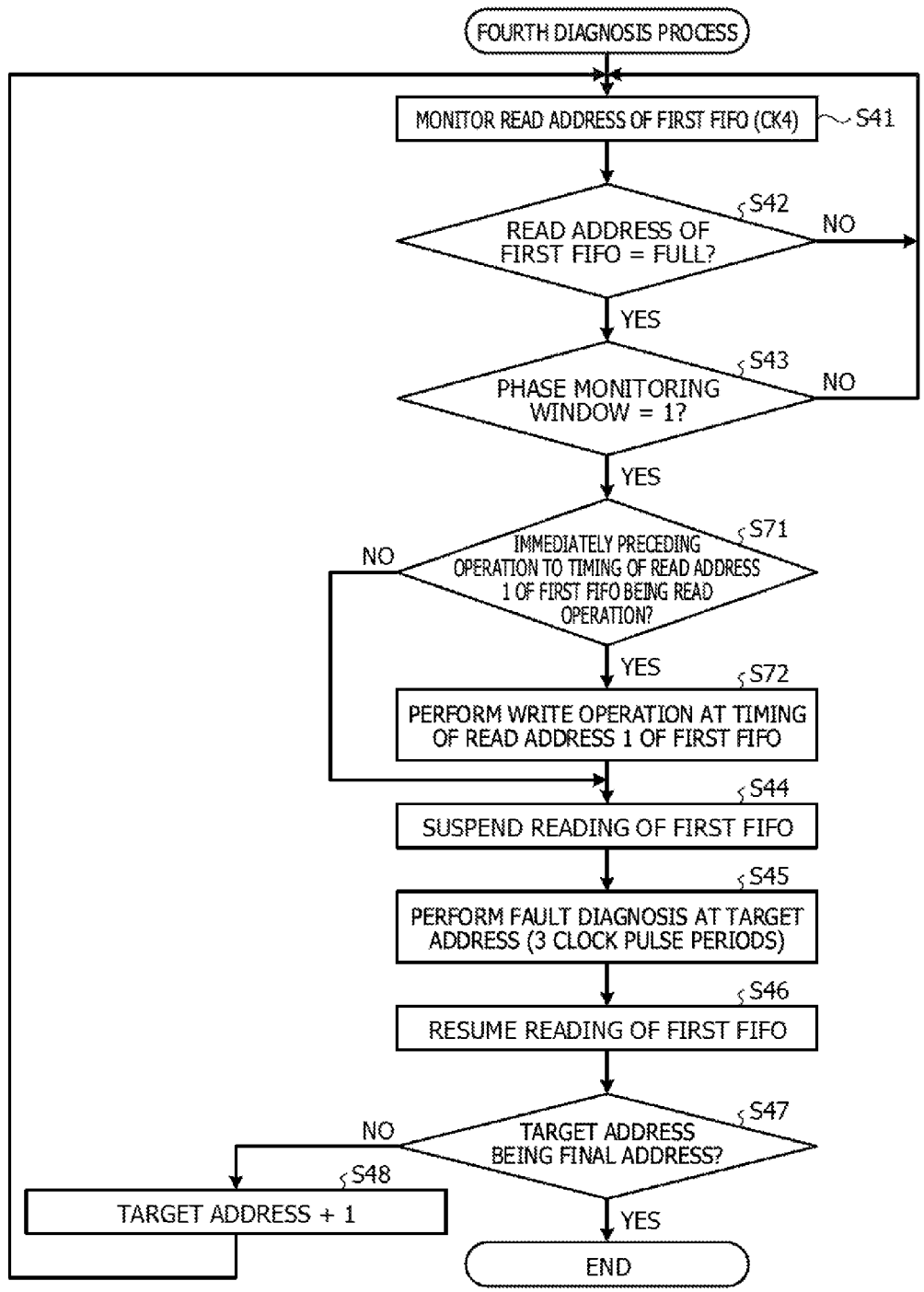
FIG. 12 is a flowchart illustrating an example of a process of a main signal processing circuit related to a fourth fault diagnosis process.
Figure 13A:
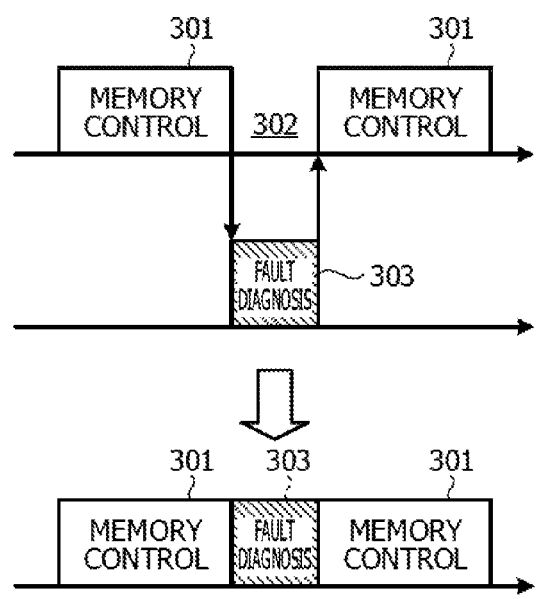
FIG. 13A illustrates an example of a fault diagnosis timing.
Figure 13B:
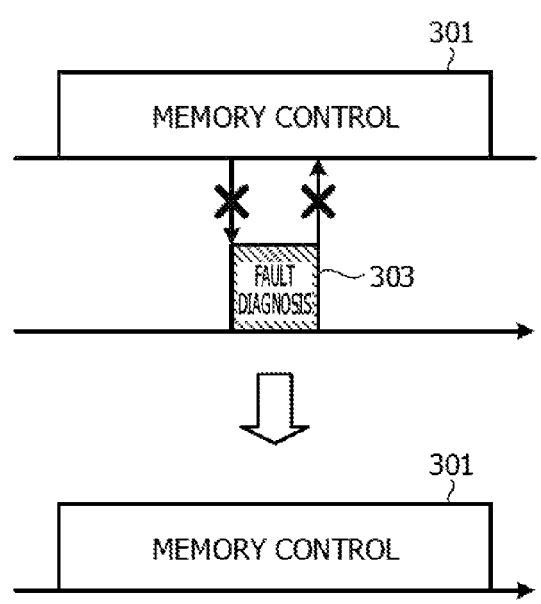
FIG. 13B illustrates an example of a fault diagnosis timing.

The operation of the transmission system 1 of the fourth embodiment is described below. FIG. 12 is a flowchart illustrating an example of an operation of a main signal processing circuit 11A related to a fourth diagnosis process. In the fourth diagnosis process, the fault diagnosis is performed at the target address while the statistics counting function is active.

Referring to FIG. 12, the second monitoring unit 37 determines whether the phase monitoring window is "1" (S43). If the phase monitoring window is "1" (yes branch from S43), the second monitoring unit 37 determines whether the operation immediately preceding the timing of the read address "1" of the first FIFO 41A is a read operation (S71).

If the operation immediately preceding the timing of the read address "1" of the first FIFO 41A is not a read operation (no branch from S71), the second monitoring unit 37 proceeds to S44 to output an H-level suspend command, a diagnosis command, and an H-level interrupt command. As a result, the read addresses "1" through "3" of the first FIFO 41A are the read suspension period. During the read suspension period, the fault diagnosis unit 36B performs the read operation for the fault diagnosis at the timing of the read address "1" of the first FIFO 41A, and the inversion value write operation for the fault diagnosis at the timing of the read address "2" of the first FIFO 41A. The fault diagnosis unit 36B further performs the inversion value read operation for the fault diagnosis at the timing of the read address "3" of the first FIFO 41A.

If the operation immediately preceding the timing of the read address "1" of the first FIFO 41A is a read operation (yes branch from S71), the second monitoring unit 37 performs a write operation at the timing of the read address "1" of the first FIFO 41A (S72). After performing the write operation, the second monitoring unit 37 proceeds to S44 to output an H-level suspend command, a diagnosis command, and an H-level interrupt command. As a result, the read addresses "2" through "4" of the first FIFO 41A are the read suspension period. During the read suspension period, the fault diagnosis unit 36B performs the read operation for the fault diagnosis at the timing of the read address "2" of the first FIFO 41A, and the inversion value write operation for the fault diagnosis at the timing of the read address "3" of the first FIFO 41A. The fault diagnosis unit 36B further performs the inversion value read operation for the fault diagnosis at the timing of the read address "4" of the first FIFO 41A.

If the operation immediately preceding the timing of the read address "1" of the first FIFO 41A when the phase monitoring window "1" is detected is a read operation of the statistics counting function, the main signal processing circuit 11A performs a write operation at the timing of the read address "1". The main signal processing circuit 11A suspends the reading during three clock pulse periods at the read address "2" after the write operation is performed. During the read suspension period, the main signal processing circuit 11A performs the fault diagnosis at the target address. As a result, the transmission apparatus 2A performs the fault diagnosis while performing the statistics counting function smoothly.

If the operation immediately preceding the timing of the read address "1" of the first FIFO 41A when the phase monitoring window "1" is detected is a write operation of the statistics counting function, the main signal processing circuit 11A suspends the reading of the first FIFO 41A. The main signal processing circuit 11A performs the fault diagnosis at the target address during the read suspension period.

As a result, the transmission apparatus 2A performs the fault diagnosis while performing the statistics counting function smoothly.

The 12 clock pulse periods of the master clock signal CK of 0 through 11 are one period in the first embodiment. One period is not limited to 12 clock pulse periods, and may be modified to different clock pulse periods. The first clock signal CK1 is generated by dividing the master clock signal CK by 3, and the second clock signal CK2 is generated by dividing the master clock signal CK by 4. The frequency division ratio may be modified.

In accordance with the first embodiment, the diagnosis period is every two standard processes. The disclosure is not limited to this setting, and may be modified as appropriate. In accordance with the first embodiment, the diagnosis enabled timing within the first diagnosis period is aligned with the start timing of the first clock pulse, and the diagnosis enabled timing within the second diagnosis period is aligned with the start timing of the second clock pulse. The diagnosis enabled timing may be appropriately modified. The diagnosis enabled timing in the first diagnosis period and the diagnosis enabled timing in the second or subsequent diagnosis period are set to be different, but the two timings may be set to the same timing, such as a start timing at the first clock pulse.

The addresses of the first FIFO 41A of the second embodiment are four addresses of "1" through "4". The number of addresses of the first FIFO 41A is not limited to four, and may be modified to another number.

The transmission apparatuses 2 and 2A of the third and fourth embodiments includes the statistics counting function as a standard process. The standard process is not limited to the statistics counting function, and may include another function.

The transmission apparatuses 2 and 2A of the first through fourth embodiments are L2SW that transmits a packet. But the transmission apparatuses 2 and 2A of the first through fourth embodiments are not limited to L2SW. The transmission apparatuses 2 and 2A of the first through fourth embodiments may be applicable to an apparatus that reads or writes data through an optical signal, an electrical signal, or the like on the memory 26A (36A).

The transmission apparatuses 2 and 2A of the first through fourth embodiments include the memory 26A (36A). Alternatively, a memory external to the transmission apparatuses 2 and 2A may be used. The disclosure is applicable when the fault diagnosis is performed on the external memory.

The transmission apparatus 2 of the first embodiment generates the first clock signal CK1 and the second clock signal CK2 from the master clock signal CK therewithin. Alternatively, the transmission apparatus 2 may extract the first clock signal CK1 from the packet signal, and generate the higher rate, second clock signal CK2 from the extracted, first clock signal CK1. The transmission apparatus 2A of the second embodiment generates the third clock signal CK3 and the fourth clock signal CK4 therewithin. Alternatively, the transmission apparatus 2A may extract the third clock signal CK3 from the packet signal, and generate the higher rate, fourth clock signal CK4 from the extracted, third clock signal CK3.

The elements in each block are not necessarily configured physically as illustrated. Distribution and integration of the elements are not limited to those illustrated, and the elements may be functionally or physically distributed or integrated by any unit depending on the workload or use status of each element.

Part or whole of the operations, processes, and functions performed by each apparatus may be performed by a central processing unit (CPU), a digital signal processor (DSP), a field programmable gate array (FPGA), or the like. Part or whole of the operations, processes, and functions may be performed by an analysis executing program running on the CPU, or on a wired-logic hardware configuration.

Regions storing a variety of information may include a read-only memory (ROM), or a random-access memory (RAM), such as a synchronous dynamic random access memory (SDRAM), a magnetoresistive random access memory (MRAM), or a non-volatile random access memory (NVRAM).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A diagnosis method executed by a processor included in a transmission apparatus, the diagnosis method comprising:
   receiving signal data at a timing of a first clock signal within a first period;
   receiving the signal data and diagnosing a memory, at timings of a second clock signal that is higher than the first clock signal within a second period following the first period; and
   repeating a combination of the first period and the second period according to a predetermined cycle, wherein
   the receiving the signal data within the second period includes receiving the signal data during each of a plurality of cycles of the second clock signal generated in the second period, and
   the diagnosing the memory within the second period includes diagnosing the memory using diagnosis data during one cycle of the second clock signal at which the signal data is not received within the second period.

2. The diagnosis method according to claim 1, further comprising
   setting the second period each time a plurality of the first periods has elapsed.

3. The diagnosis method according to claim 2,
   wherein the first period and the second period correspond to a specific clock pulse count of a master clock signal generated by a generator circuit.

4. The diagnosis method according to claim 3, further comprising:
   generating the first clock signal by frequency-dividing the master clock with a first frequency divider; and
   generating the second clock signal by frequency-dividing the master clock with a second frequency divider having a division ratio higher than a division ratio of the first frequency divider.

5. The diagnosis method according to claim 1, wherein the diagnosing includes:
   temporarily writing the signal data on a buffer at the timing of the first clock signal;
   outputting the signal data, written at the timing of the first clock signal, as the signal data that is to be written at the timing of the second clock signal by reading and outputting the signal data written on the buffer with a read rate of the buffer adjusted;
   generating the second period by suspending the read operation from the buffer when a read timing of the signal data from the buffer matches a write timing of the signal data onto the buffer; and
   executing at least one of an operation of the diagnosing the memory during a diagnosis period within the second period.

6. The diagnosis method according to claim 1, further comprising:
   transmitting an alarm signal to a management apparatus that manages the transmission apparatus when the memory is diagnosed to be faulty;
   receiving from the management apparatus a control signal responsive to the alarm signal; and
   executing an operation to transmit and receive signal data in response to the control signal.

7. The diagnosis method according to claim 1,
   wherein the diagnosing includes executing, during a plurality of diagnosis periods, a save operation to read data at a target address for the diagnosis of the memory, and to save the read data onto a buffer register, an inversion value write operation to write an inversion value of the data at the target address onto the target address of the memory, an inversion value read operation to read the data written at the target address on the memory and to determine results of the read data, and a restore operation to restore the data on the memory by writing the data saved on the buffer register at the target address on the memory.

8. The diagnosis method according to claim 7, wherein the diagnosing includes:
   counting a progress count each time one of the save operation, the inversion value write operation, the inversion value read operation, and the restore operation has been performed;
   setting an address different from the target address to be a new target address when the progress count has reached a specific value; and
   diagnosing the new target address.

9. A transmission apparatus, comprising:
   a memory; and
   a processor coupled to the memory and configured to:
   receive signal data at a timing of a first clock signal within a first period,
   receive the signal data and diagnosing a memory, at timings of a second clock signal that is higher than the first clock signal within a second period following the first period, and
   repeat a combination of the first period and the second period according to a predetermined cycle,
   wherein the processor is configured to:
   receive the signal data during each of a plurality of cycles of the second clock signal generated in the second period, and
   diagnose the memory using diagnosis data during one cycle of the second clock signal at which the signal data is not received within the second period.

10. A non-transitory computer-readable recording medium storing a program that causes a processor included in a transmission apparatus to execute a process, the process comprising:
    receiving signal data at a timing of a first clock signal within a first period;

receiving the signal data and diagnosing a memory, at timings of a second clock signal that is higher than the first clock signal within a second period following the first period; and repeating a combination of the first period and the second period according to a predetermined cycle, wherein the receiving the signal data within the second period includes receiving the signal data during each of a plurality of cycles of the second clock signal generated in the second period, and the diagnosing the memory within the second period includes diagnosing the memory using diagnosis data during one cycle of the second clock signal at which the signal data is not received within the second period.

11. The transmission apparatus according to claim 9, wherein the processor is configured to:

temporarily write the signal data on a buffer at the timing of the first clock signal;

output the signal data, written at the timing of the first clock signal, as the signal data that is to be written at the timing of the second clock signal by reading and outputting the signal data written on the buffer with a read rate of the buffer adjusted;

generate the second period by suspending the read operation from the buffer when a read timing of the signal data from the buffer matches a write timing of the signal data onto the buffer; and execute at least one of an operation of the diagnosis of the memory during a diagnosis period within the second period.

12. The transmission apparatus according to claim 9, wherein the processor is configured to execute, during a plurality of diagnosis periods, a save operation to read data at a target address for the diagnosis of the memory, and to save the read data onto a buffer register, an inversion value write operation to write an inversion value of the data at the target address onto the target address of the memory, an inversion value read operation to read the data written at the target address on the memory and to determine results of the read data, and a restore operation to restore the data on the memory by writing the data saved on the buffer register at the target address on the memory.

13. The recording medium according to claim 10, wherein the diagnosing includes:

temporarily writing the signal data on a buffer at the timing of the first clock signal;

outputting the signal data, written at the timing of the first clock signal, as the signal data that is to be written at the timing of the second clock signal by reading and outputting the signal data written on the buffer with a read rate of the buffer adjusted;

generating the second period by suspending the read operation from the buffer when a read timing of the signal data from the buffer matches a write timing of the signal data onto the buffer; and executing at least one of an operation of the diagnosing the memory during a diagnosis period within the second period.

14. The recording medium according to claim 10, wherein the diagnosing includes executing, during a plurality of diagnosis periods, a save operation to read data at a target address for the diagnosis of the memory, and to save the read data onto a buffer register, an inversion value write operation to write an inversion value of the data at the target address onto the target address of the memory, an inversion value read operation to read the data written at the target address on the memory and to determine results of the read data, and a restore operation to restore the data on the memory by writing the data saved on the buffer register at the target address on the memory.

* * * * *